(12) United States Patent
Murata

(10) Patent No.: US 8,471,297 B2
(45) Date of Patent: Jun. 25, 2013

(54) SEMICONDUCTOR MEMORY DEVICE AND METHOD OF MANUFACTURING THE SAME

(75) Inventor: Takeshi Murata, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 117 days.

(21) Appl. No.: 13/070,963

(22) Filed: Mar. 24, 2011

(65) Prior Publication Data

US 2012/0025386 A1 Feb. 2, 2012

(30) Foreign Application Priority Data

Aug. 2, 2010 (JP) ................................. 2010-173933

(51) Int. Cl.
*H01L 23/52* (2006.01)

(52) U.S. Cl.
USPC ............ 257/211; 257/774; 257/775; 257/776

(58) Field of Classification Search
USPC .................. 257/253, 658, 751; 438/775, 306, 438/750, 773, 296, 300, 307, 248; 35/51, 35/63, 173, 148
See application file for complete search history.

(56) References Cited

U.S. PATENT DOCUMENTS

| | | | |
|---|---|---|---|
| 6,528,888 B2* | 3/2003 | Cho et al. ........................ | 257/775 |
| 6,917,532 B2* | 7/2005 | Van Brocklin et al. .......... | 365/51 |
| 7,291,878 B2* | 11/2007 | Stipe .............................. | 257/296 |
| 7,440,339 B2* | 10/2008 | Nejad et al. ............... | 365/189.08 |
| 7,920,408 B2* | 4/2011 | Azuma et al. .................. | 365/148 |
| 8,183,602 B2* | 5/2012 | Tabata et al. .................. | 257/211 |
| 2006/0197115 A1* | 9/2006 | Toda .............................. | 257/248 |
| 2008/0179746 A1* | 7/2008 | Hur et al. ....................... | 257/751 |
| 2009/0134432 A1 | 5/2009 | Tabata et al. | |
| 2012/0268978 A1* | 10/2012 | Shibata ........................... | 365/63 |

FOREIGN PATENT DOCUMENTS

JP 2009-130140 A 6/2009

* cited by examiner

*Primary Examiner* — Steven Loke
*Assistant Examiner* — David Goodwin
(74) *Attorney, Agent, or Firm* — Oblon, Spivak, McClelland, Maier & Neustadt, L.L.P.

(57) ABSTRACT

A semiconductor memory device according to an embodiment includes a cell array block having a plurality of cell arrays stacked therein, each of the cell arrays including a plurality of memory cells and a plurality of selective wirings selecting the plurality of memory cells are stacked, a pillar-shaped first via extending in a stack direction from a first height to a second height and having side surfaces connected to a first wiring, and a pillar-shaped second via extending in the stack direction from the first height to the second height and having side surfaces connected to a second wiring upper than the first wiring, the second wiring being thicker in the stack direction than the first wiring and having a higher resistivity than the first wiring.

14 Claims, 18 Drawing Sheets

(CROSS SECTION IN WORD LINE DIRECTION)   (CROSS SECTION IN BIT LINE DIRECTION)

SEMICONDUCTOR MEMORY DEVICE AND METHOD OF MANUFACTURING THE SAME

CROSS-REFERENCE TO RELATED APPLICATIONS

This application is based upon and claims the benefit of priority from the prior Japanese Patent Application No. 2010-173933, filed on Aug. 2, 2010, the entire contents of which are incorporated herein by reference.

FIELD

An embodiment relates to a semiconductor memory device and a method of manufacturing the same.
Description of the Related Art

BACKGROUND

A resistance change memory such as a ReRAM (resistive RAM) may be formed into a cross point type. Therefore, cell arrays can be easily stacked so that the integration degree can be improved. However, when the number of cell arrays stacked is simply increased, cost increase and yield reduction may be caused. For instance, when a wiring layer is electrically connected to another wiring layer, a via is formed between the wiring layers. The formation of such a via with respect to each layer increases the number of layers, leading to cost increase.

Accordingly, a manufacturing method for forming a via at the same time with respect to wiring layers of a plurality of previously stacked cell arrays has hitherto been proposed. In this method, first, a lower wiring layer, an intermediate wiring layer, and an upper wiring layer are sequentially stacked from below. In that case, a slit is formed in a connecting portion of the intermediate wiring layer to a via. Then, a via from the top of the intermediate wiring layer to the lower wiring layer through the slit is formed. In that case, the via is formed so that steps which engage the connecting portion of the intermediate wiring layer can be made on its side surfaces. Thereby, the lower wiring layer and the intermediate wiring layer can be electrically connected. Further, when the upper wiring layer is formed at the upper end of the via formed in this manner, three wiring layers can be connected by one-time via formation. In other words, according to this method, even when the number of cell arrays stacked is increased, the number of processes of lithography and etching for via formation can be reduced so that cost increase and yield reduction can be suppressed.

However, in this manufacturing method, since the via across the plurality of wirings is formed in the position of the slit formed in the connecting portion of one intermediate wiring layer, an amount of the etching on the connecting portion of the intermediate wiring layer is larger than when the via is formed in each layer. Therefore, the periphery of the slit of the connecting portion of the intermediate wiring layer is removed, with the result that the contact thereof with the via becomes unstable. This becomes more significant as the number of wiring layers stacked between the lower wiring layer and the intermediate wiring layer is larger.

DETAILED DESCRIPTION

A semiconductor memory device according to an embodiment includes a cell array block having a plurality of cell arrays stacked therein, each of the cell arrays including a plurality of memory cells and a plurality of selective wirings selecting the plurality of memory cells are stacked, a pillar-shaped first via extending in a stack direction from a first height to a second height and having side surfaces connected to a first wiring, and a pillar-shaped second via extending in the stack direction from the first height to the second height and having side surfaces connected to a second wiring upper than the first wiring, the second wiring being thicker in the stack direction than the first wiring and having a higher resistivity than the first wiring.

Hereinafter, a semiconductor memory device and a method of manufacturing the same according to an embodiment will be described with reference to the drawings.

Figure 1:
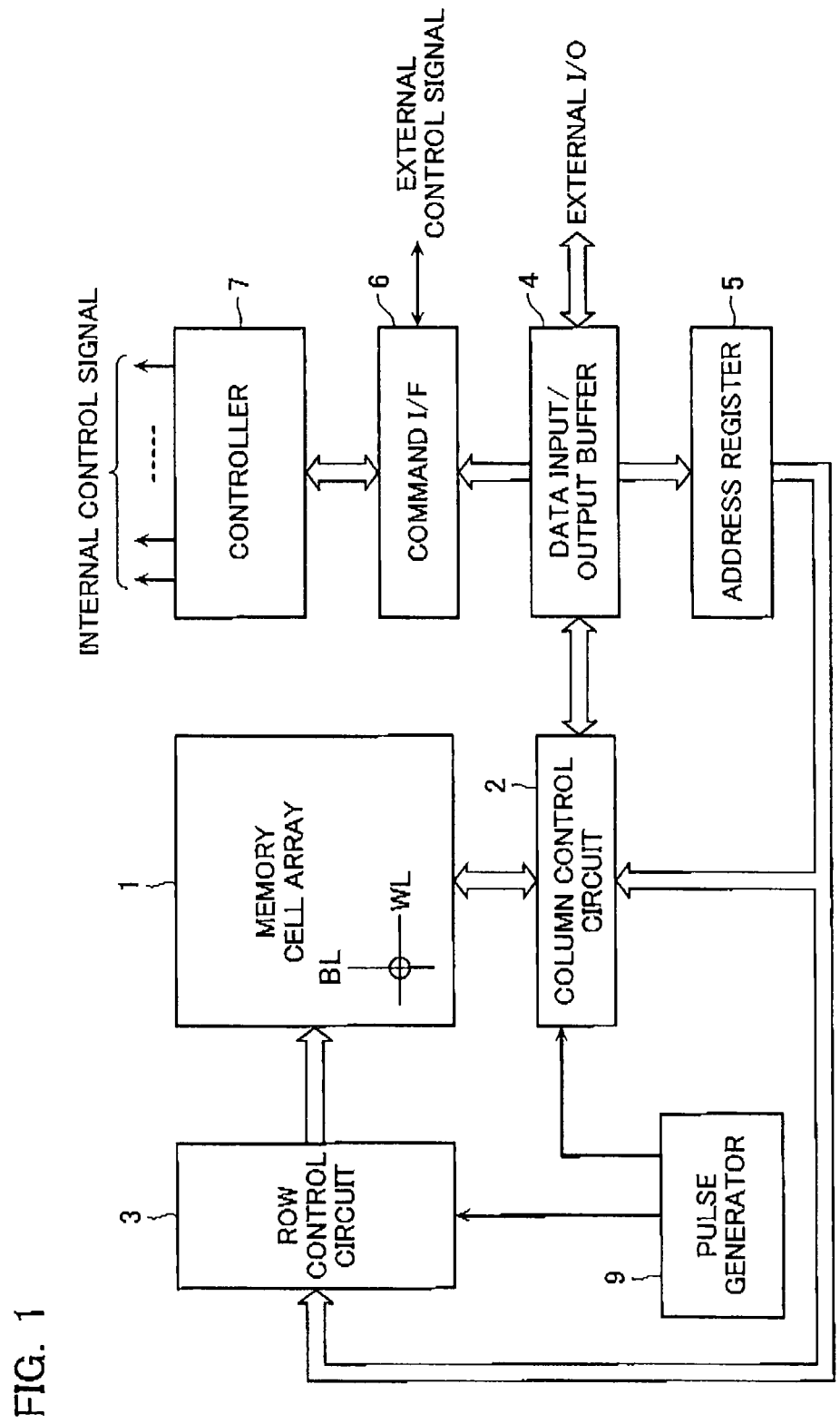
FIG. 1 is a block diagram of a semiconductor memory device according to a first embodiment.

[The Structure of a Semiconductor Memory Device]
FIG. 1 is a block diagram of a semiconductor memory device according to an embodiment.

The semiconductor memory device includes a cell array block in which a plurality of memory cell arrays 1 having memory cells using later-described ReRAMs (variable resistance elements) arranged in a matrix are stacked. A column control circuit 2 which controls a bit line BL of each of the memory cell arrays 1 and performs erase of data of the memory cells, write of data to the memory cells, and read of data from the memory cells is provided in the position adjacent in the bit line direction of the memory cell array 1. In addition, a row control circuit 3 which selects a word line WL of the memory cell array 1 and applies a voltage necessary for erase of data of the memory cells, write of data to the memory cells, and read of data from the memory cells is provided in the position adjacent in the word line direction of the memory cell array 1.

A data input/output buffer 4 is connected to an external host, not shown, via an I/O line, receives write data, receives an erase instruction, outputs read data, and receives address data and command data. The data input/output buffer 4 transmits received write data to the column control circuit 2, and receives data read from the column control circuit 2 to output it to the outside. An address supplied from the outside to the data input/output buffer 4 is transmitted via an address register 5 to the column control circuit 2 and the row control circuit 3. In addition, a command supplied from the host to the data input/output buffer 4 is transmitted to a command interface 6. The command interface 6 receives an external control signal from the host, determines whether data input to the data input/output buffer 4 is write data, a command, or an address, and when it is a command, it is transferred as a reception command signal to a controller 7. The controller 7 manages the entire semiconductor memory device, and receives a command from the host to perform read, write, erase, and data input/output management. The external host can also receive status information managed by the controller 7, and determine the operation result. The status information is used for controlling write and erase.

In addition, a pulse generator 8 is controlled by the controller 7. By this control, the pulse generator 8 can output a pulse with an arbitrary voltage at arbitrary timing. Specifically, the controller 7 inputs an address provided from the outside via the address register 5, determines to which memory layer it accesses, and uses a parameter corresponding to the memory layer to control the height and width of the pulse from the pulse generator 8. The parameter is a value determined so that the write characteristics of the memory layers are uniform by grasping the write characteristics of the memory layers, and is stored in the memory cell. Here, the formed pulse can be transferred to the arbitrary wirings selected by the column control circuit 2 and the row control circuit 3.

Further, a peripheral circuit element other than the memory cell array 1 can be formed on a silicon substrate immediately below the memory cell array 1. Thereby, the chip area of the semiconductor memory device can be substantially equal to the area of the memory cell array 1.

Figure 2:
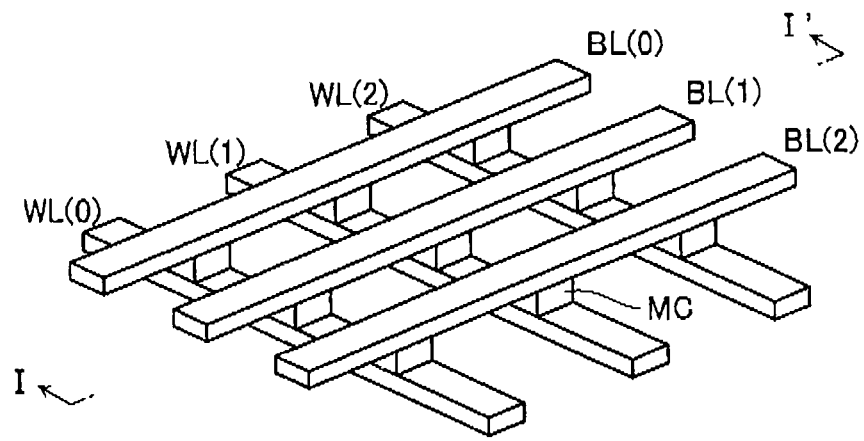
FIG. 2 is a perspective view showing a portion of a memory cell array of the semiconductor memory device.
Figure 3:
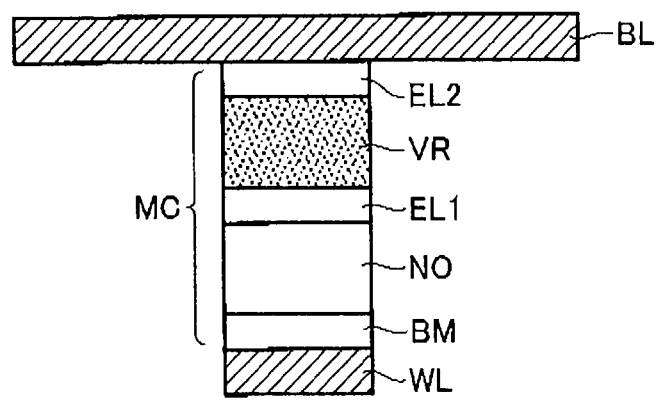
FIG. 3 is a cross-sectional view taken along line I-I' of FIG. 2 of one memory cell viewed in the arrow directions.

FIG. 2 is a perspective view of a portion of the memory cell array 1. FIG. 3 is a cross-sectional view taken along line I-I' of FIG. 2 of one memory cell viewed in the arrow directions.

A plurality of bit lines BL(0) to BL(2) are disposed in parallel, a plurality of word lines WL(0) to WL(2) are disposed in parallel so as to cross the bit lines, and a memory cell MC is arranged in each of the crossing portions so as to be sandwiched between both the lines. Materials resistant to heat and having a low resistance value are desirable for the word lines WL and the bit lines BL. For instance, W, WSi, NiSi, and CoSi can be used.

As shown in FIG. 3, the memory cell MC has a series connection circuit of a variable resistance element VR and a non-ohmic element NO.

The variable resistance element VR can change a resistance value through an electric current, heat, and a chemical energy by voltage application, and has on the upper and lower sides thereof electrodes EL2 and EL1 functioning as a barrier metal and an adhesive layer. As electrode materials, Pt, Au, Ag, TiAlN, SrRuO, Ru, Run, Ir, Co, Ti, TiN, TaN, LaNiO, Al, PtIrO$_x$, PtRhO$_x$, Rh/TaAlN are used. In addition, a metal film to make orientation uniform can be inserted. Further, a buffer layer, a barrier metal layer, and an adhesive layer can be separately inserted.

As the variable resistance element VR, one which changes a resistance value by phase transition of a crystalline state and an amorphous state like chalcogenide (PCRAM), one which changes a resistance value by precipitating metal cations to form a bridge (conducting bridge) between electrodes or by ionizing precipitated metal to break the bridge (CBRAM), and one which changes a resistance value by voltage application or electric current application (ReRAM) (which is largely classified into one causing resistance change according to the presence or absence of electric charge trapped by an electric charge trap present at an electrode interface and one causing resistance change according to the presence or absence of a conductive path caused by oxygen deficiency) can be used.

Figure 4:
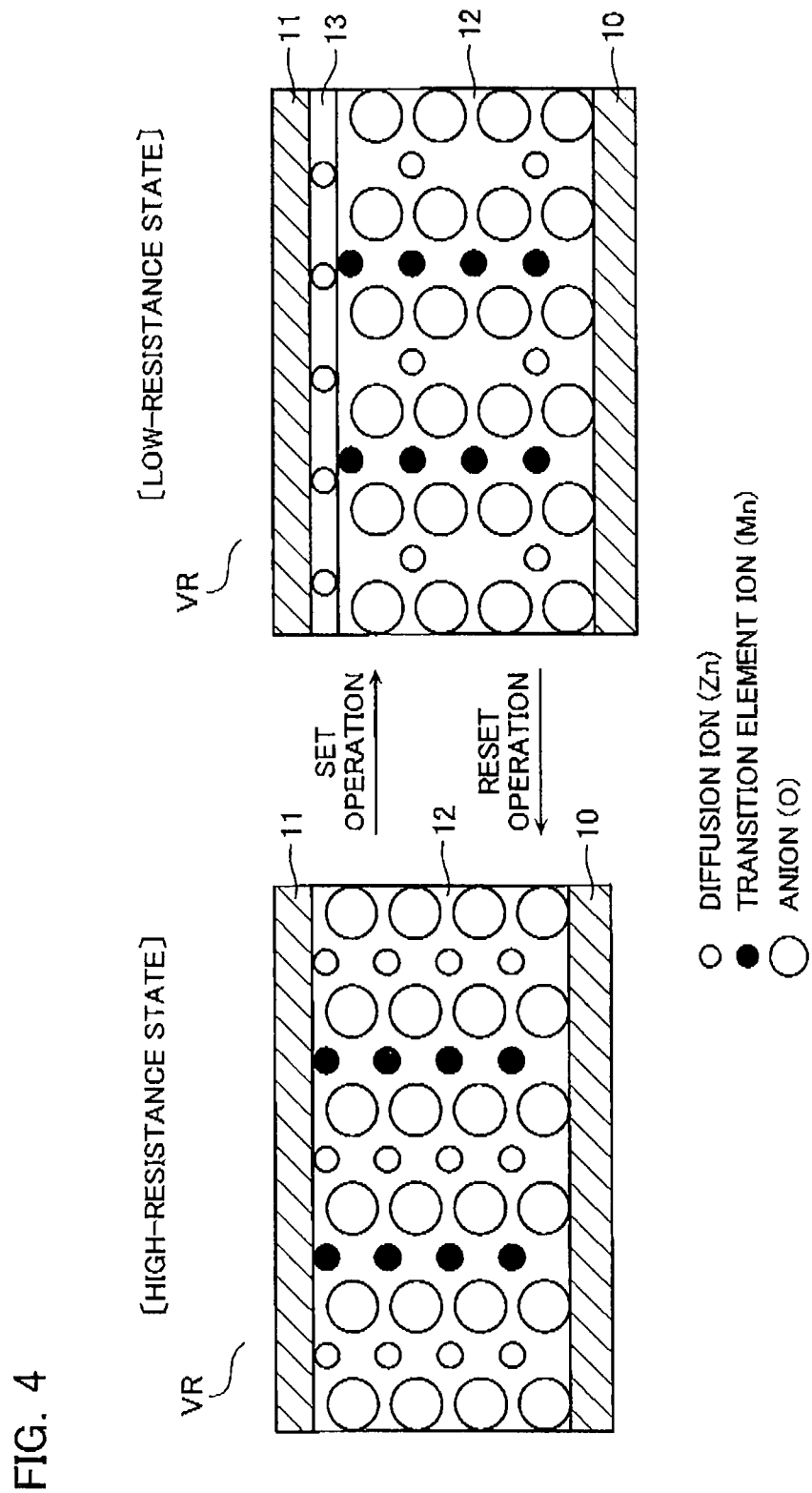
FIG. 4 is a schematic cross-sectional view showing an example of a variable resistance element of the semiconductor memory device.

FIG. 4 is a diagram showing an example of the variable resistance element VR. The variable resistance element VR shown in FIG. 4 has a recording layer 12 between electrode layers 10 and 11. The recording layer 12 includes a composite compound having at least two types of cation elements. At least one of the cation elements is a transition element having a d orbital in which electrons are incompletely filled, and the shortest distance between the adjacent cation elements is 0.32 nm or less. Specifically, the compound is expressed by a chemical formula $A_xM_yX_z$ (A and M are elements different from each other), and is made of a material having a crystalline structure such as a spinel structure ($AM_2O_4$), an ilmenite structure ($AMO_3$), a delafossite structure ($AMO_2$), an LiMoN$_2$ structure ($AMN_2$), a wolframite structure ($AMO_4$), an olivine structure ($A_2MO_4$), a hollandite structure ($A_xMO_2$), a ramsdellite structure ($A_xMO_2$), and a perovskite structure ($AMO_3$).

In the example of FIG. 4, A is Zn, M is Mn, and X is O. Each of the small white circles in the recording layer 12 indicates a diffusion ion (Zn), each of the large white circles indicates an anion (O), and each of the small black circles indicates a transition element ion (Mn). The initial state of the recording layer 12 is the high-resistance state, but when the electrode layer 10 is at a fixed potential and a negative voltage is applied to the electrode layer 11 side, part of the diffusion ions in the recording layer 12 moves to the electrode layer 11 side so that the number of the diffusion ions in the recording layer 12 relatively decreases with respect to the anions. The diffusion ions which have moved to the electrode layer 11 side receive electrons from the electrode layer 11 to precipitate them as metal, thereby forming the metal layer 11. The number of the anions becomes excessive in the recording layer 12, with the result that the valence number of the transition element ions in the recording layer 12 increases. Thereby, the recording layer 12 is allowed to have electron conductivity by carrier implantation to complete the set operation. For reproduction, a very small electric current value to the extent that the material configuring the recording layer 12 cannot cause resistance change should be flowed. To reset the program state (low-resistance state) to the initial state (high-resistance state), for instance, a large electric current should be flowed to the recording layer 12 for a sufficient time for Joule heating, thereby promoting the oxidation-reduction reaction of the recording layer 12. In addition, the reset operation is enabled by applying an electric field in the opposite direction of the setting.

[The Structures of the Memory Cell Array and its Peripheral Portion]

Next, the structures of the memory cell array and its peripheral portion will be described.

Figure 5:
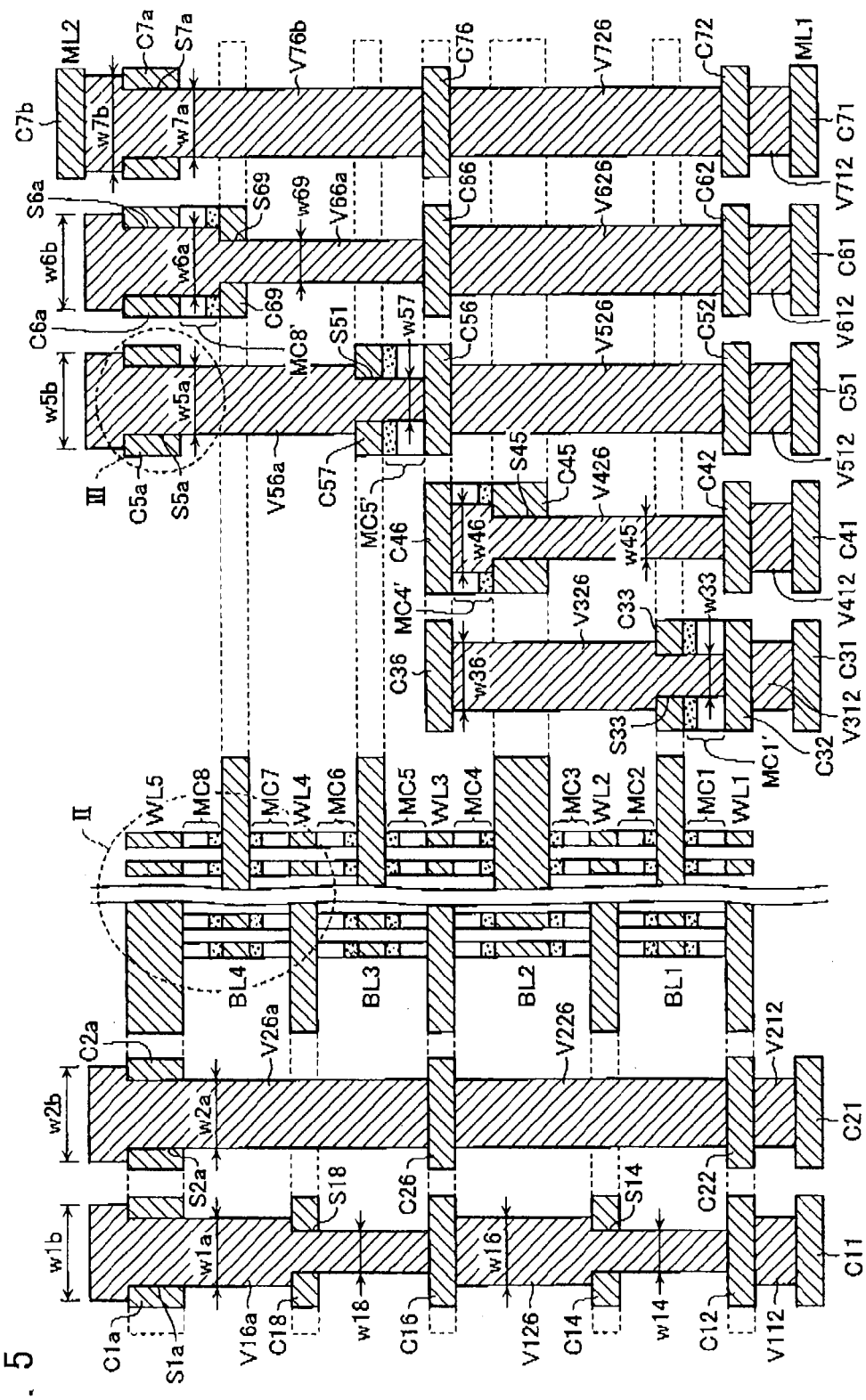
FIG. 5 is a schematic diagram showing the connection of word lines, bit lines, and vias of the semiconductor memory device.
Figure 6:
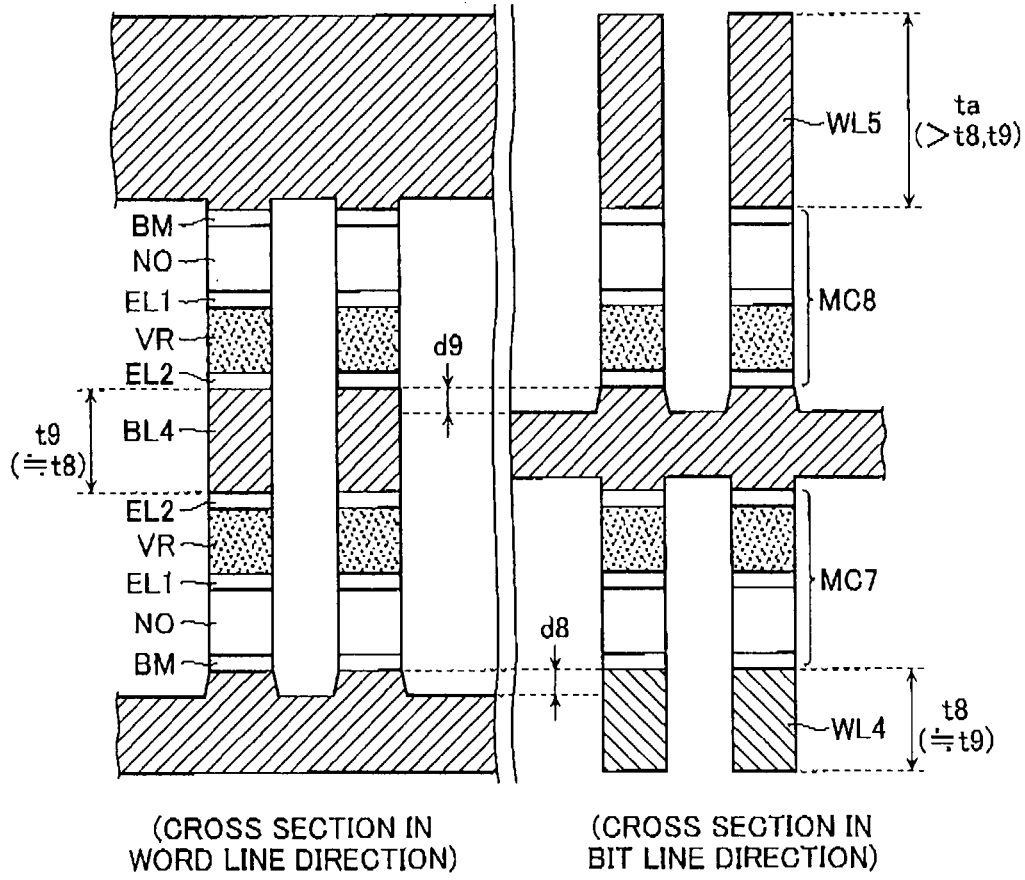
FIG. 6 is an enlarged view of a portion surrounded by the dotted line indicated by II of FIG. 5.
Figure 7:
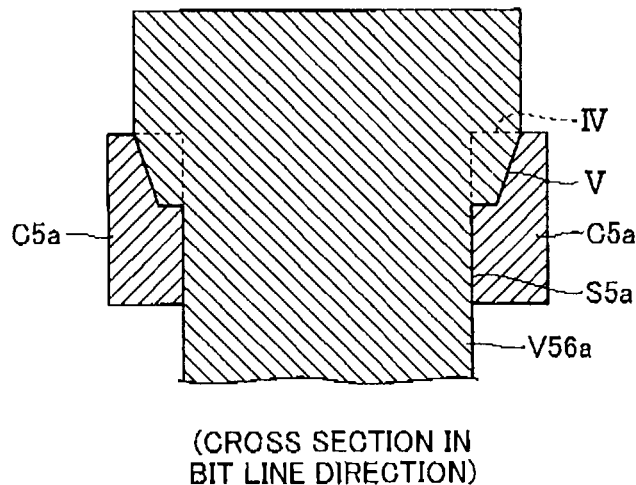
FIG. 7 is an enlarged view of a portion surrounded by the dotted line indicated by III of FIG. 5.

FIG. 5 is a schematic diagram showing the connection of the word lines WL, the bit lines BL, and vias V of the semiconductor memory device according to this embodiment. In addition, FIGS. 6 and 7 are enlarged views of portions surrounded by the dotted line circles II and III of FIG. 5, respectively. Further, for the sake of convenience, FIG. 5 shows a cross-sectional view in the word line direction on the left side, and a cross-sectional view in the bit line direction on the right side. In addition, although an interlayer dielectric is formed between each of the word lines and each of the bit lines, it is not shown for the sake of convenience.

A metal layer ML1, the word line WL1, the bit line BL1, the word line WL2, the bit line BL2, ..., a bit line BL5, a word line WL5, and a metal layer ML2 are formed in the semiconductor memory device from the lower layer to the upper layer. Wirings for connecting the peripheral circuits such as the column control circuit 2 and the row control circuit 3 and the power source are formed in the metal layers ML1 and ML2.

In addition, memory cells MC1, MC2, ..., and MC8 are formed in the crossing portions of the word line WL1 and the bit line BL1, the bit line BL1 and the word line WL2, ..., and the bit line BL4 and the word line WL5. Connecting portions C11, C21, ..., C71 are formed on the same layer. Connecting portions C12, C22, ..., C72, and the word line WL1 are formed on the same layer. A connecting portion C33 and the bit line BL1 are formed on the same layer. A connecting portion C14 and the word line WL2 are formed on the same layer. A connecting portion C45 and the bit line BL2 are formed on the same layer. Connecting portions C16, C26, ..., C76, and the word line WL3 are formed on the same layer. A connecting portion C57 and the bit line BL3 are formed on the same layer. A connecting portion C16 and the word line WL4 are formed on the same layer. A connecting portion C69 and the bit line BL4 are formed on the same layer. Connecting portions C1a, C2a, ..., C7a, and the word line WL5 are formed on the same layer.

Further, a plurality of vias V extending in the stack direction and connecting the word lines WL, the bit lines BL, and the metal layers ML are formed in the peripheral portion of the memory cell array of the semiconductor memory device. The vias V will be listed and described below.

A via V112 connects the connecting portion C11 formed in the metal layer ML1 and the connecting portion C12 formed in the word line WL1.

A via V126 is formed from the upper surface of the connecting portion C12 to the lower surface of the connecting portion C16 formed in the word line WL3 through the connecting portion C14 formed in the word line WL2. A slit S14 having a width w14 in the word line direction is formed in the connecting portion C14, and the via V126 is formed so as to bury the slit S14. In other words, the cross-sectional shape of the via V126 is determined by the slit S14. Specifically, the via V126 has a stepwise cross section having the width w14 and a width w16 larger than the width w14. The width w16 is an upper portion of the via V126 and is narrower toward the lower layer such that the width in the word line direction from the lower surface of the connecting portion C16 to the upper surface of the connecting portion C14. The width w14 is a lower portion of the via V126 and is narrower toward the lower layer such that the width in the word line direction from the upper surface of the connecting portion C14 to the upper surface of the connecting portion C12, The steps of the via V126 engage the upper surfaces of the connecting portion C14, so that the via V126 connects the connecting portions C12 and C16 to the connecting portion C14.

A via V16a is formed from the upper surface of the connecting portion C16 (a first height) to the lower surface of the metal layer ML2 (a second height) through the connecting portion C18 formed in the word line WL4 and the connecting portion C1a formed in the word line WL5. A slit S18 having a width w18 in the word line direction is formed in the connecting portion C18, a slit S1a having a width w1a in the word line direction larger than the width w18 is formed in the connecting portion C1a, and the via V16a is formed so as to bury the slits S18 and S1a. Specifically, the via V16a has a stepwise cross section having a width w18, width w1a lager than the width w18 and a width w1b lager than the width w1a. The width w1b is an upper portion of the via V16a and is narrower toward the lower layer such that the width in the word line direction from the lower surface of the metal layer ML2 to the upper surface of the connecting portion C1a. The width w1a is middle portion of the via V16a and is narrower toward the lower layer such that the width in the word line direction from the upper surface of the connecting portion C1a to the upper surface of the connecting portion C18. The width w18 is a lower portion of the via V16a and is narrower toward the lower layer such that the width in the word line direction from the upper surface of the connecting portion C18 to the upper surface of the connecting portion C16. The via V16a forms steps by engaging the slit Sla of the connecting portion C1a and the slit S18 of the connecting portion C18, connects the connecting portion C16 to the bottom surface of the via V16a, and connects the connecting portions C18 and C1a to the bottom surfaces and the side surfaces of the steps.

A via V212 connects the connecting portion C21 formed in the metal layer ML1 and the connecting portion C22 formed in the word line WL1.

A via V226 connects the connecting portion C22 and the connecting portion C26 formed in the word line WL3.

A via V26a is formed from the upper surface of the connecting portion C26 (a first height) to the lower surface of the metal layer ML2 (a second height) through the connecting portion C2a formed in the word line WL5. A slit S2a having a width w2a in the word line direction is formed in the connecting portion C2a, and the via V26a is formed so as to bury the slit S2a. Specifically, the via V26a has a stepwise cross section having the width w2a and a width w2b larger than the width w2a. The width w2b is an upper portion of the via V26a and is narrower toward the lower layer such that the width in the word line direction from the height of the lower surface of the metal layer ML2 to the upper surface of the connecting portion C2a. The width w2a is a lower portion of the via V26a and is narrower toward the lower layer such that the width in the word line direction from the upper surface of the connecting portion C2a to the upper surface of the connecting portion C26. The via V26a forms steps by engaging the slit S2a of the connecting portion C2a, connects the connecting portion C26 to the bottom surface of the via V26a, and connects the connecting portion C2a to the bottom surfaces and the side surfaces of the steps.

A via V312 connects the connecting portion C31 formed in the metal layer ML1 and the connecting portion C32 formed in the layer of the word line WL1. Further, the via V312 does not connect the connecting portion C32 and the word line WL1.

A via V326 is formed from the upper surface of the connecting portion C32 to the lower surface of the connecting portion C36 formed in the layer of the word line WL3 through the connecting portion C33 formed in the bit line BL1. A slit S33 having a width w33 in the bit line direction is formed in the connecting portion C33, and the via V326 is formed so as to bury the slit S33. Specifically, the via V326 has a stepwise cross section having the width w33 and a width w36 larger than the width w33. The width w36 is an upper portion of the via V326 and is narrower toward the lower layer such that the width in the bit line direction from the lower surface of the connecting portion C36 to the upper surface of the connecting portion C33. The width w33 is a lower portion of the via V326 and is narrow toward the lower layer such that the width in the bit line direction from the upper surface of the connecting portion C33 to the upper surface of the connecting portion C32. The via V326 forms steps by engaging the slit S33 of the connecting portion C33, connects the connecting portions C32 and C36 to the bottom surface and the upper surface of the via V326, and connects the connecting portion C33 to the bottom surfaces and the side surfaces of the steps. Further, the via V326 does not connect the connecting portion C32 and the word line WL1. Further, the via V326 does not connect the connecting portion C36 and the word line WL3.

A via V412 connects the connecting portion C41 formed in the metal layer ML1 and the connecting portion C42 formed in the layer of the word line WL1. Further, the via V412 does not connect the connecting portion C42 and the word line WL1.

A via V426 is formed from the upper surface of the connecting portion C42 to the lower surface of the connecting portion C46 formed in the layer of the word line WL3 through the connecting portion C45 formed in the bit line BL2. A slit S45 having a width w45 in the bit line direction is formed in the connecting portion C45, and the via V426 is formed so as to bury the slit S45. Specifically, the via V426 has a stepwise cross section having the width w45 and a width w46 larger than the width w45. The width w46 is an upper portion of the via V426 and is narrower toward the lower layer such that the width in the bit line direction from the lower surface of the connecting portion C46 to the upper surface of the connecting portion C45. The width w45 is a lower portion of the via V426 and is narrower toward the lower layer such that the width in the bit line direction from the upper surface of the connecting portion C45 to the upper surface of the connecting portion C42. The via V426 forms steps by engaging the slit S45 of the connecting portion C45, connects the connecting portions C42 and C46 to the bottom surface and the upper surface of the via V426, and connects the connecting portion C45 to the bottom surfaces and the side surfaces of the steps. Further, the via V426 does not connect the connecting portion C42 and the word line WL1. Further, the via V426 does not connect the connecting portion C46 and the word line WL3.

A via V512 connects the connecting portion C51 formed in the metal layer ML1 and the connecting portion C52 formed in the word line WL1. Further, the via V512 does not connect the connecting portion C52 and the word line WL1.

A via V526 connects the connecting portion C52 and the connecting portion C56 formed in the layer of the word line WL3. Further, the via V526 does not connect the connecting portion C56 and the word line WL3.

A via V56a is formed from the upper surface of the connecting portion C56 (a first height) to the lower surface of the metal layer ML2 (a second height) through the connecting portion C57 formed in the bit line BL3 and the connecting portion C5a formed in the layer of the word line WL5. A slit S57 having a width w57 in the bit line direction is formed in the connecting portion C57, a slit S5a having a width w5a in the bit line direction larger than the width w57 is formed in the connecting portion C5a, and the via V56a is formed so as to bury the slits S57 and S5a. Specifically, the via V56a has a stepwise cross section having the width w57, the width w5a larger than the width w57 and a width w5b larger than the width w5a. The width w5b is an upper portion of the via V56a and is narrower toward the lower layer such that the width in the bit line direction from the lower surface of the metal layer ML2 to the upper surface of the connecting portion C5a. The width w5a is a middle portion of the via V56a and is narrower toward the lower layer such that the width in the bit line direction from the upper surface of the connecting portion C5a to the upper surface of the connecting portion C57. The width w57 is an lower portion of the via V56a and is narrower toward the lower layer such that the width in the bit line direction from the upper surface of the connecting portion C57 to the upper surface of the connecting portion C56. The via V56a forms steps by engaging the slit S5a of the connecting portion C5a and the slit S57 of the connecting portion C57, connects the connecting portion C56 to the bottom surface of the via V56a, and connects the connecting portions C57 and C5a to the bottom surfaces and the side surfaces of the steps. Further, the via V56a does not connect the connecting portion C5a and the word line WL5.

A via V612 connects the connecting portion C61 formed in the metal layer ML1 and the connecting portion C62 formed in the layer of the word line WL1. Further, the via V612 does not connect the connecting portion C62 and the word line WL1.

A via V626 connects the connecting portion C62 and the connecting portion C66 formed in the layer of the word line WL3. Further, the via V626 does not connect the connecting portion C66 and the word line WL3.

A via V66a is formed from the upper surface of the connecting portion C66 (a first height) to the lower surface of the metal layer ML2 (a second height) through the connecting portion C69 formed in the bit line BL4 and the connecting portion C6a formed in the layer of the word line WL5. A slit S69 having a width w69 in the bit line direction is formed in the connecting portion C69, a slit S6a having a width w6a in the bit line direction larger than the width w69 is formed in the connecting portion C6a, and the via V66a is formed so as to bury the slits S69 and S6a. Specifically, the via V66a has a stepwise cross section having the width w69, the width w6a larger than the width w69 and a width w6b larger than the width w6a. The width w6b is an upper portion of the via V66a and is narrower toward the lower layer such that the width in the bit line direction from the lower surface of the metal layer ML2 to the upper surface of the connection porting C6a. The width w6a is a middle portion of the via V66a and is narrower toward the lower layer such that the width in the bit line direction from the upper surface of the connecting portion C6a to the upper surface of the connecting portion C69. The width w69 is a lower portion of the via V66a and is narrower toward the lower layer such that the width in the bit line direction from the upper surface of the connecting portion C69 to the upper surface of the connecting portion C66. The via V66a forms steps by engaging the slit S6a of the connecting portion C6a and the slit S69 of the connecting portion C69, connects the connecting portion C66 to the bottom surface of the via V66a, and connects the connecting portions C69 and C6a to the bottom surfaces and the side surfaces of the steps. Further, the via V66a does not connect the connecting portion C6a and the word line WL5.

A via V712 connects the connecting portion C71 formed in the metal layer ML1 and the connecting portion C72 formed in the layer of the word line WL1. Further, the via V712 does not connect the connecting portion C72 and the word line WL1.

A via V726 connects the connecting portion C72 and the connecting portion C76 formed in the layer of the word line WL3. Further, the via V726 does not connect the connecting portion C76 and the word line WL3.

A via V76b is formed from the upper surface of the connecting portion C76 (a first height) to the lower surface of the connecting portion C7b formed in the metal layer ML2 (a second height) through the connecting portion C7a formed in the layer of the word line WL5. A slit S7a having a width w7a in the bit line direction is formed in the connecting portion C7a, and the via V76b is formed so as to bury the slit S7a. Specifically, the via V76b has a stepwise cross section having the width w7a and a width w7b larger than the width w7a. The width w7b is an upper portion of the via V76b and is narrower toward the lower layer such that the width in the bit line direction from the lower surface of the connecting portion C7b to the upper surface of the connecting portion C7a. The width w7a is a lower portion of the via V76b and is narrower toward the lower layer such that the width in the bit line direction from the upper surface of the connecting portion C7a to the upper surface of the connecting portion C76. The via V76b forms steps by engaging the slit S7a of the connecting portion C7a, connects the connecting portions C76 and C7b to the bottom surface and the upper surface of the via V76b, and connects the connecting portion C7a to the bottom surfaces and the side surfaces of the steps. Further, the via V76b does not connect the connecting portion C7a and the word line WL5.

Here, the bit line BL2 and the word line WL5 (second wirings) are formed to be thicker than other word lines WL and bit lines BL (first wirings). For instance, as shown in FIG. 6, while the word line WL4 and the bit line BL4 are formed with thicknesses t8 and t9 (t8≈t9), the word line WL5 is formed with t0 (>t8, t9) thicker than t8 and t9.

Here, when the bit line BL2, the word line WL5, and other word lines WL and bit lines BL are formed with the same resistivity, the resistance value of the bit line BL2 and the word line WL5 is lower than that of other word lines WL and bit lines BL. Therefore, the bit line BL2 and the word line WL5 are formed of a material having a higher resistivity than that of other word lines WL and bit lines BL by the later-described manufacturing method so as to have about the same sheet resistance as other word lines WL and bit lines BL. In this manner, the sheet resistances of the word lines WL and the bit lines BL are about the same so that variation in the write/read characteristic of the cell arrays can be reduced, and the operation stability of the semiconductor memory device can be secured.

Further, memory cell materials MC1', MC4', MC5', and MC8' remaining under the connecting portions C33, C46, C57, and C6a remain for the process of the method of manufacturing a semiconductor memory device described below, and the presence or absence of the memory cell materials MC1' or the like does not affect the operation of the semiconductor memory device.

[Method of Manufacturing Semiconductor Memory Device]

Figure 8:
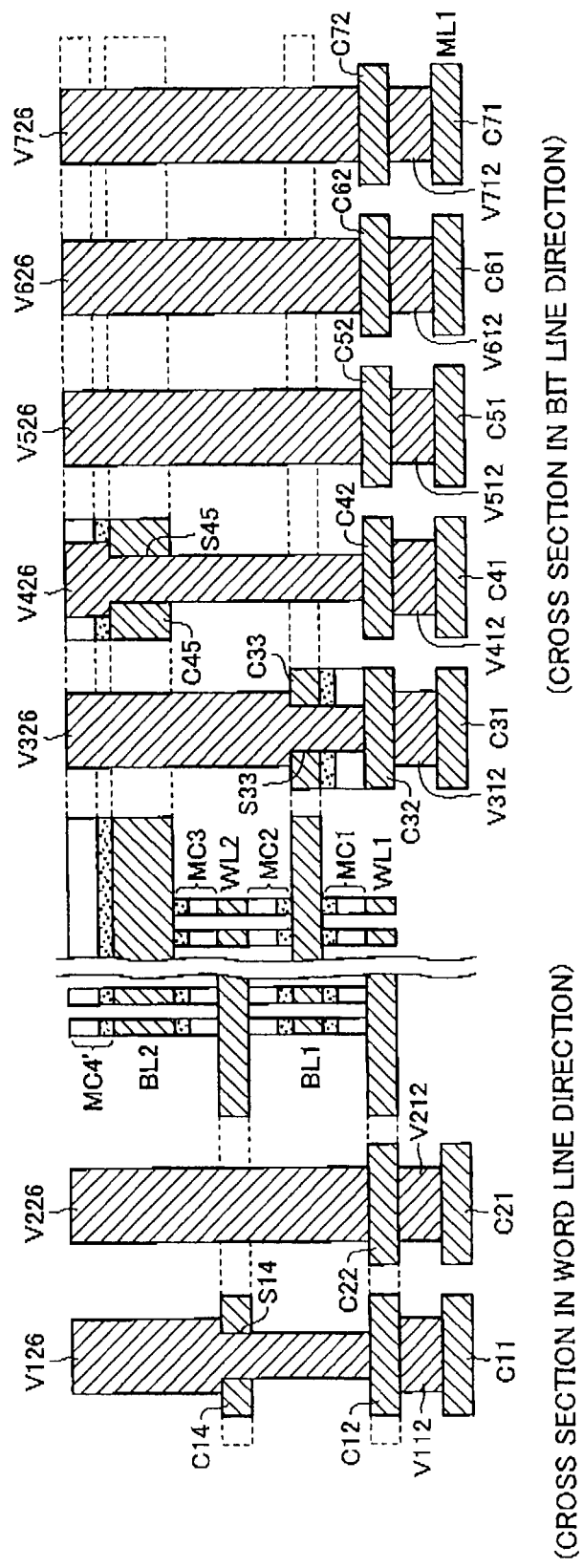
FIG. 8 is a diagram for explaining a method of manufacturing the semiconductor memory device.

Next, a method of manufacturing a semiconductor memory device shown in FIG. 5 will be described. Here, the process from the formation of the metal layer ML1 and the vies V112, V212, . . . , and V712 to the formation of the vias V126. V226, . . . , and V726 is the same as the following upper layer forming process and the description is omitted. Further, FIG. 8 shows the state after the vies V126, V226, . . . , V726 are formed.

Hereinafter, the process after the process shown in FIG. 8 will be described with reference to FIGS. 9 to 20. For simplification, FIGS. 9 to 20 do not show an interlayer dielectric.

Figure 9:
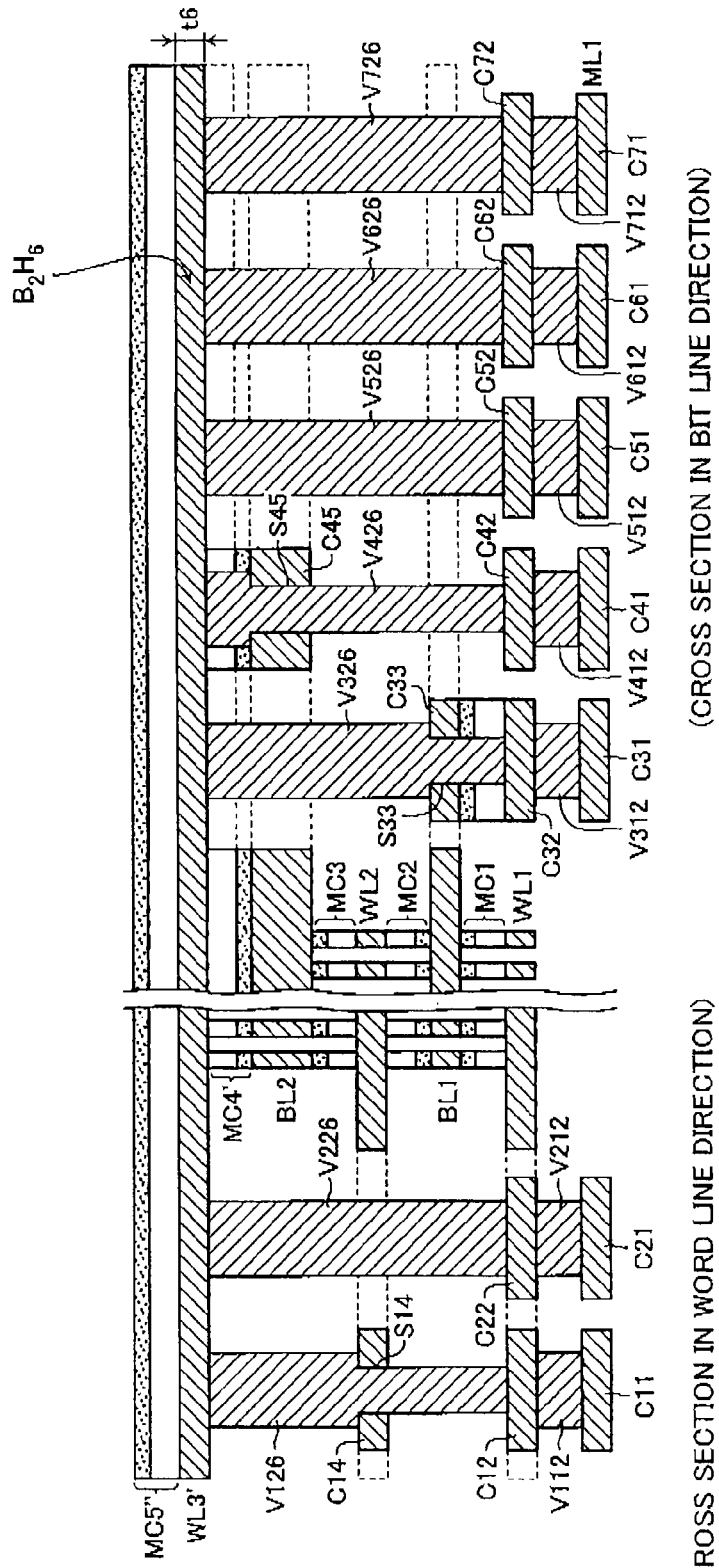
FIG. 9 is a diagram for explaining a method of manufacturing the semiconductor memory device.

First, as shown in FIG. 9, after an interlayer dielectric, not shown, between the memory cell materials MC4' and MC4' of the memory cell MC4 isolated in the bit line direction and the upper surfaces of the vias V126, V226, . . . , V726 are flattened by CMP, a material WL3' of the word line WL3 and a material MC5'' of the memory cell MC5 are sequentially stacked over these upper surfaces. Here, the word line material WL3' is stacked by about the same thickness t6 as the thickness t8 of the word line WL4 and the thickness t9 of the bit line BL4 formed later (see FIG. 6). For instance, a material made by reducing a tungsten seed (a first seed) by $B_2H_6$ (a first reducing gas) is used for the word line material WL3'.

Figure 10:
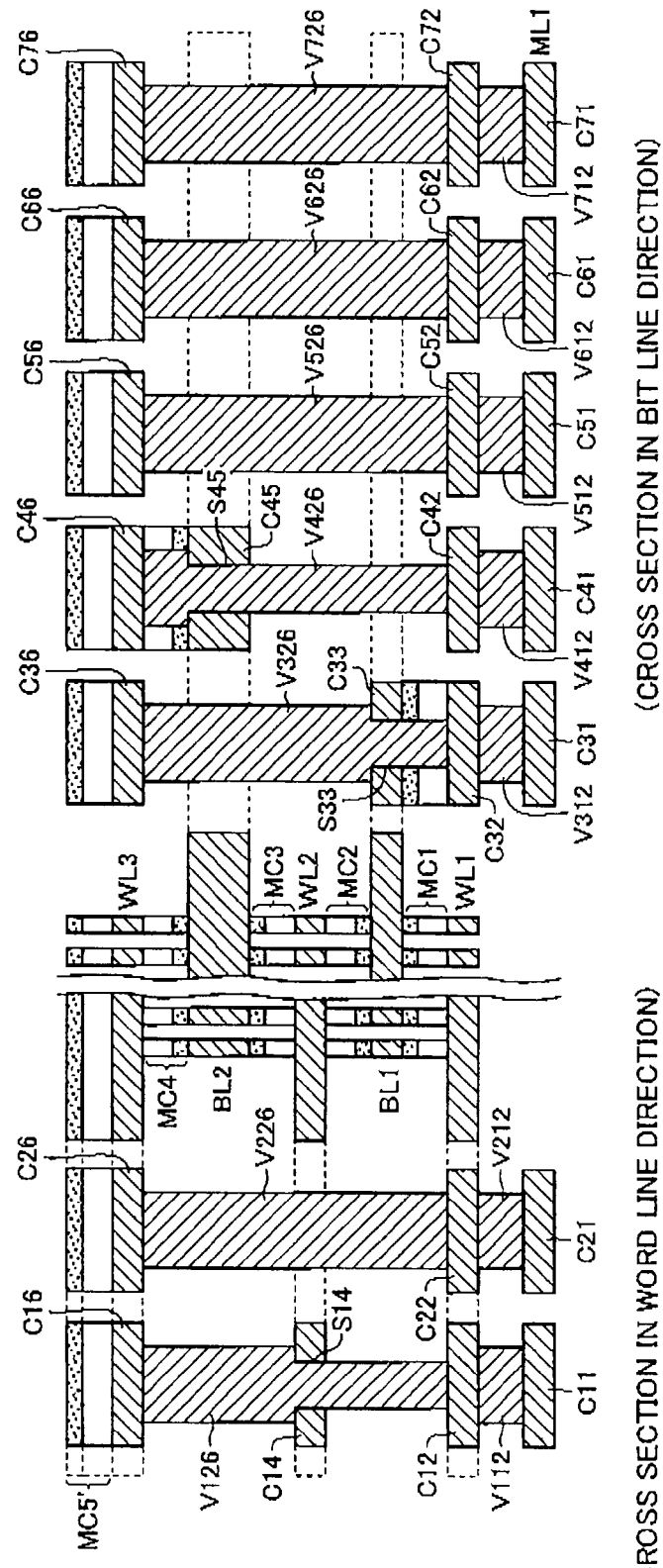
FIG. 10 is a diagram for explaining a method of manufacturing the semiconductor memory device.

As shown in FIG. 10, trenches having a depth to the upper surface of the bit line BL2 are formed in the memory cell material MC5'', the word line material WL3', and the memory cell material MC4' in the word line direction by anisotropic etching such as RIE. Insulating materials are buried into the formed trenches to form interlayer dielectrics. Thereby, the memory cell MC4 is formed in a self-aligning manner. The connecting portions C16, C26, . . . , and C76 are formed in the positions of the layer of the word line WL3 above the vias V126, V226, . . . , V726.

Figure 11:
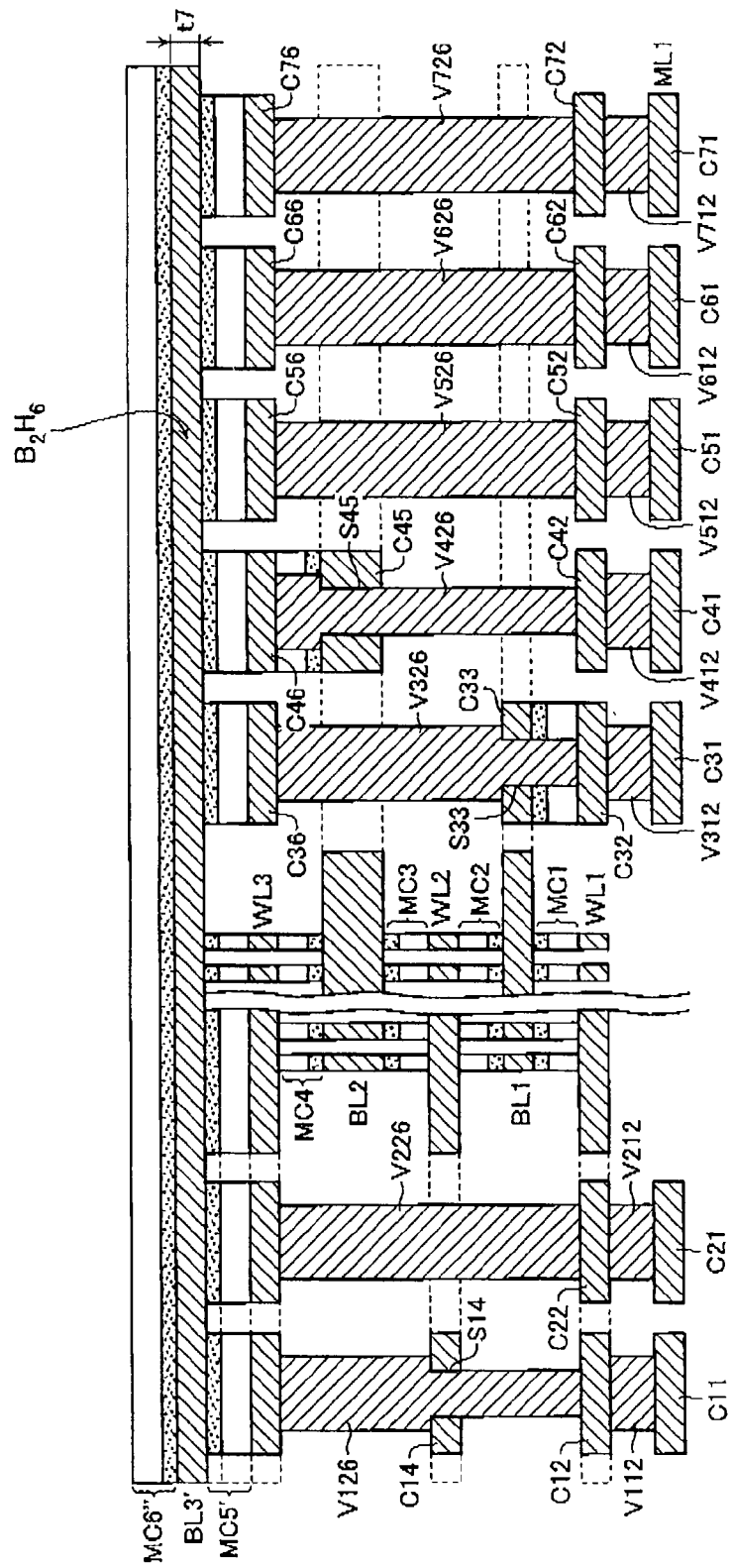
FIG. 11 is a diagram for explaining a method of manufacturing the semiconductor memory device.

As shown in FIG. 11, after the upper surfaces of the interlayer dielectrics, not shown, between the memory cell material MC5' and the memory cell material MC5' isolated in the word line direction are flattened by CMP, a material BL3' of the bit line BL3 (a first wiring) and a material MC6'' of the memory cell MC6 are sequentially stacked over these upper surfaces. Here, as described above, the bit line material BL3' is stacked with about the same thickness t7 as the thickness t8 of the word line WL4 and the thickness t9 of the bit line BL4. For instance, the same material as the word line material WL3', such as the material made by reducing a tungsten seed (a first seed) by $B_2H_6$ (a first reducing gas), is used for the bit line material BL3'.

Figure 12:
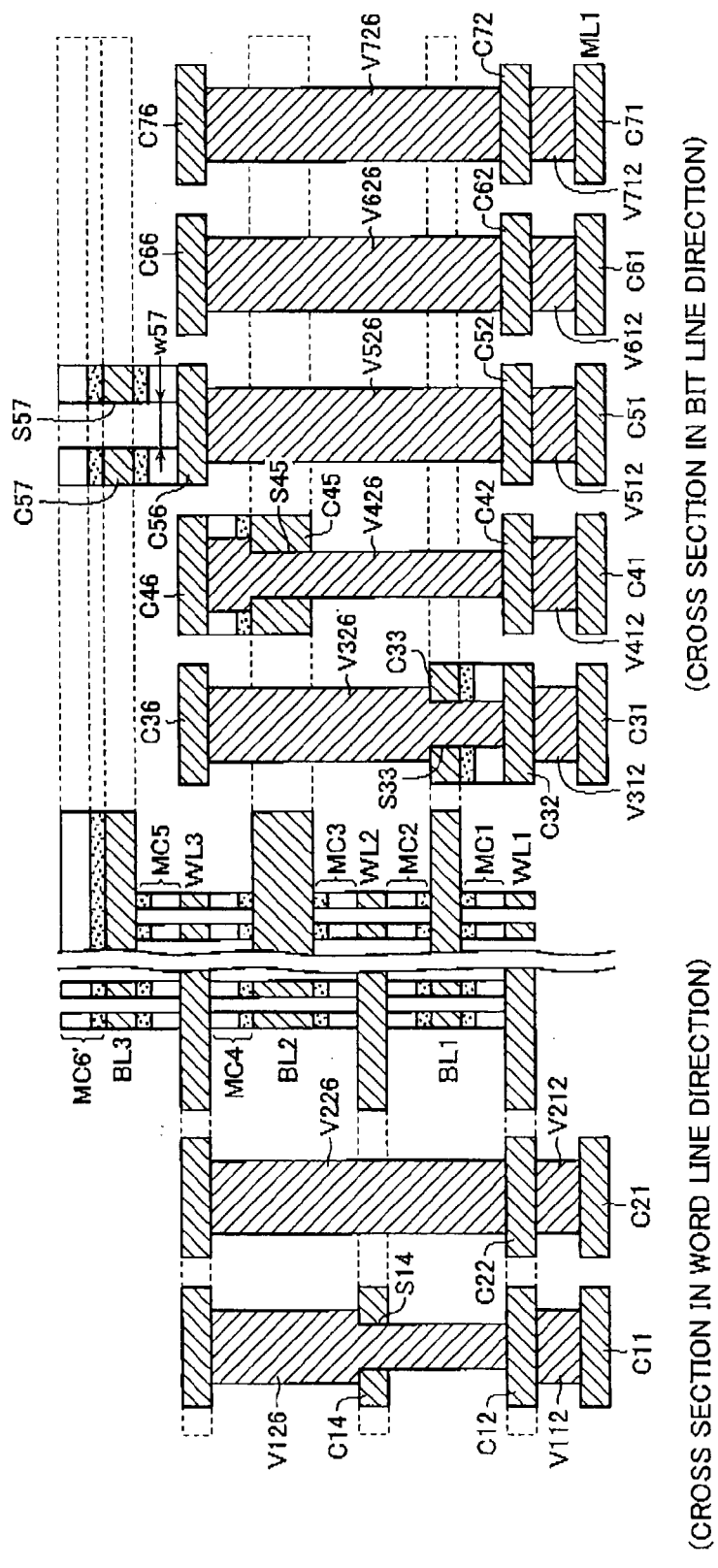
FIG. 12 is a diagram for explaining a method of manufacturing the semiconductor memory device.

As shown in FIG. 12, trenches having a depth to the upper surface of the word line WL3 are formed in the memory cell material MC6'', the bit line material BL3', and the memory cell material MC5' in the bit line direction by anisotropic etching such as RIE. Insulating materials are buried into the formed trenches to form interlayer dielectrics. Thereby, the memory cell MC5 is formed in a self-aligning manner. The connecting portion C57 having the slit S57 is formed in the position of the layer of the bit line BL5 above the connecting portion C56. At the time of anisotropic etching in this process, actually, as in the later-described word line WL4, gouging in which the upper portion is removed by over-etching is caused in the word line WL3.

Figure 13:
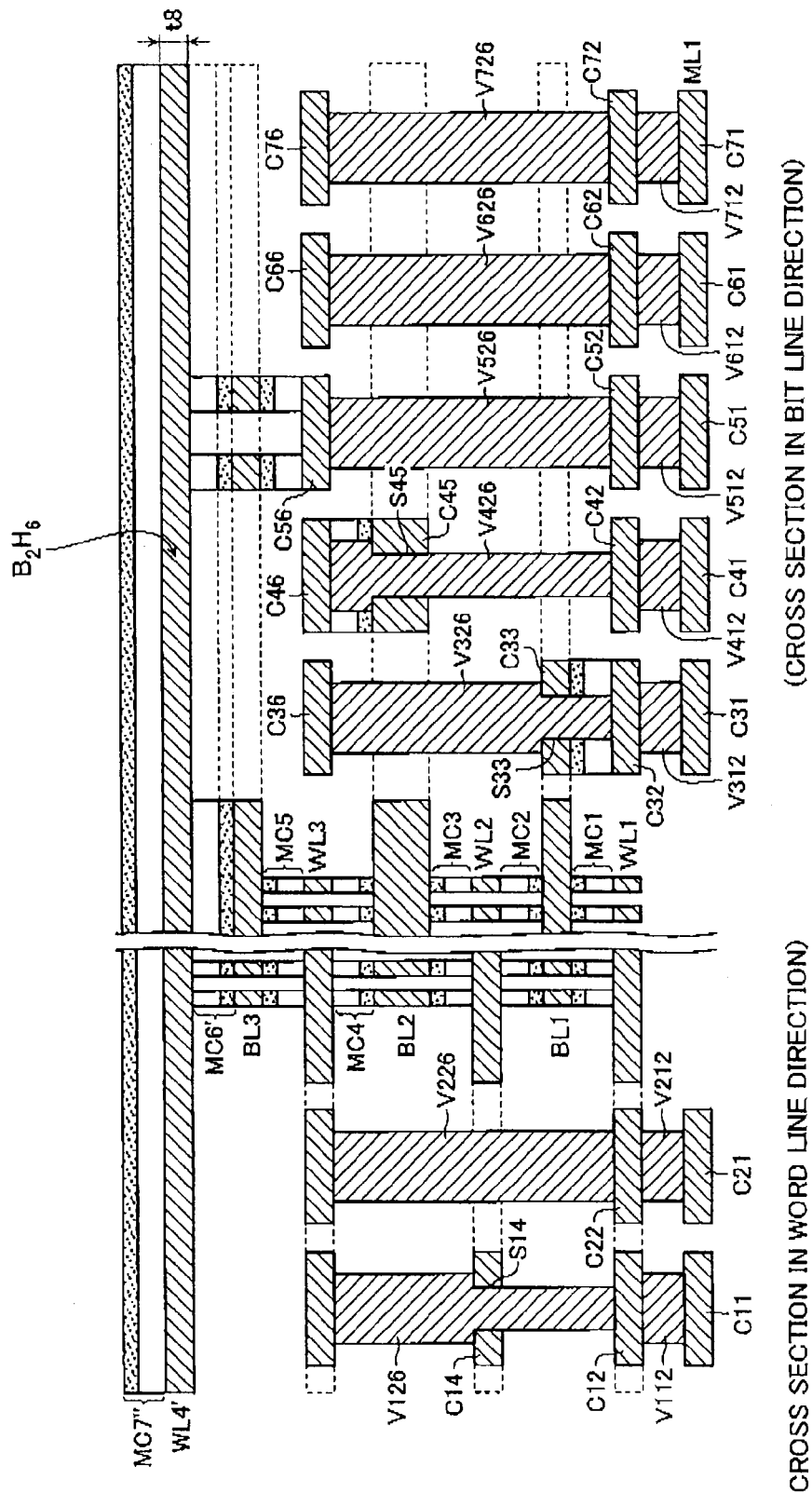
FIG. 13 is a diagram for explaining a method of manufacturing the semiconductor memory device.

As shown in FIG. 13, after the upper surfaces of the interlayer dielectrics, not shown, between memory cell materials MC6' isolated in the bit line direction are flattened by CMP, a material WL4' of the word line WL4 (a first wiring) and a material MC7'' of the memory cell MC7 are sequentially stacked over these upper surfaces. Here, as described above, the word line material WL4' is stacked with the thickness t8. For instance, the same material as the word line material WL3', such as the material made by reducing a tungsten seed (a first seed) by $B_2H_6$ (a first reducing gas), is used for the word line material WL4'.

Figure 14:
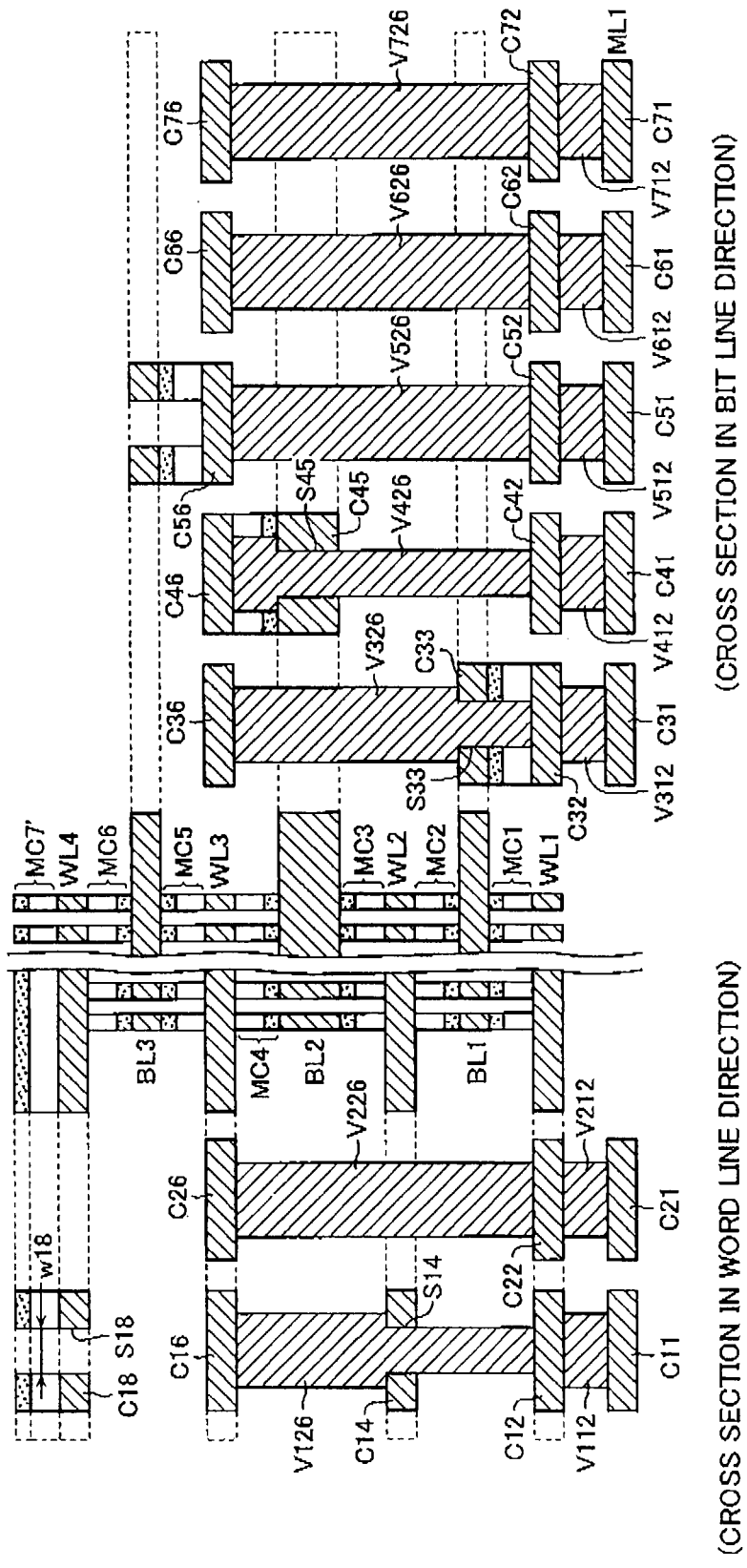
FIG. 14 is a diagram for explaining a method of manufacturing the semiconductor memory device.

As shown in FIG. 14, trenches having a depth to the upper surface of the bit line BL3 are formed in the memory cell material MC7'', the word line material WL4', and the memory cell material MC6' in the word line direction by anisotropic etching such as RIE. Insulating materials are buried into the formed trenches to form the interlayer dielectrics. Thereby, the memory cell MC6 is formed in a self-aligning manner. The connecting portion C18 having the slit S18 is formed in the position of the layer of the word line WL4 above the connecting portion C16. At the time of anisotropic etching in this process, actually, as in the later-described word line WL4, gouging is caused in the upper portion of the bit line BL3.

Figure 15:
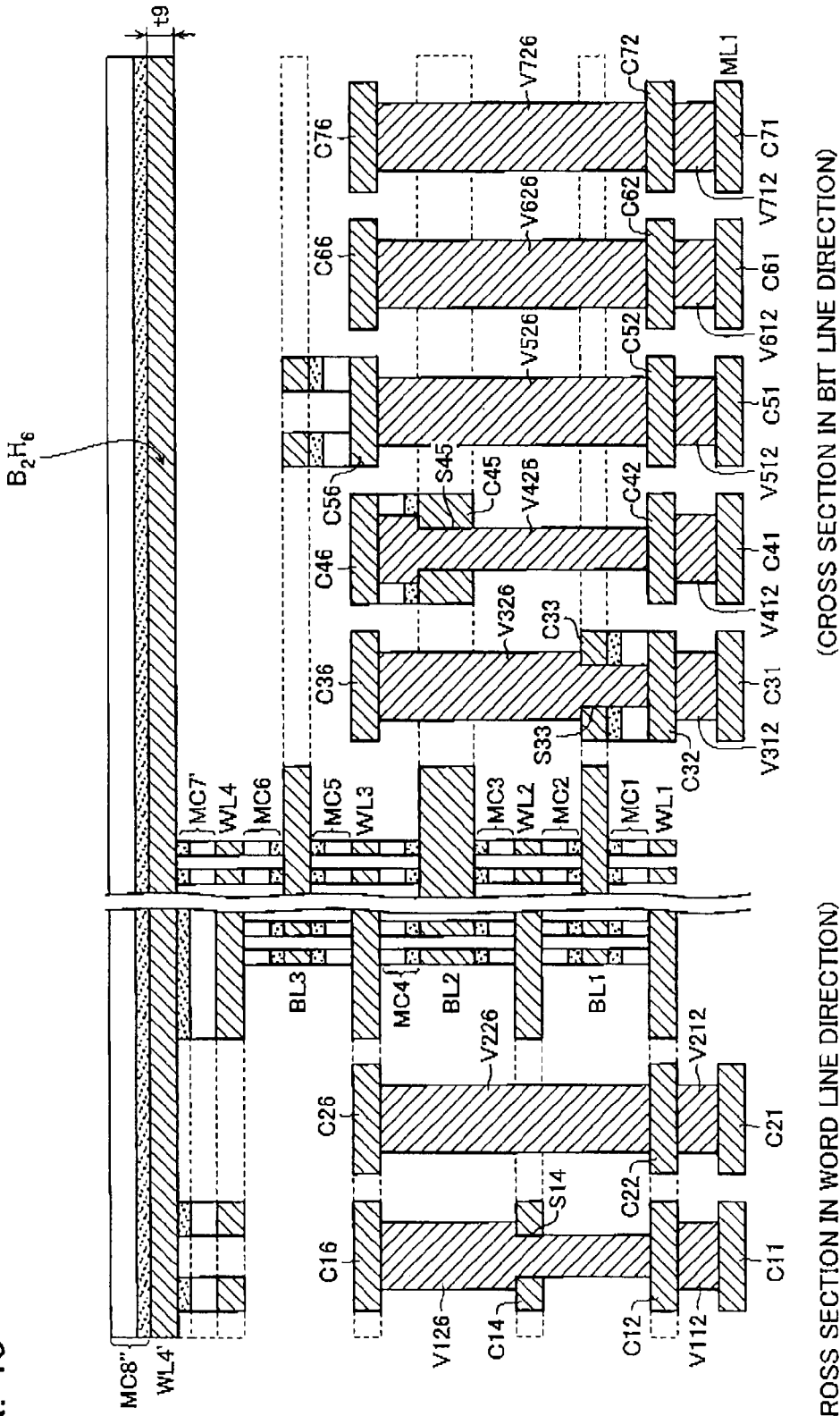
FIG. 15 is a diagram for explaining a method of manufacturing the semiconductor memory device.

As shown in FIG. 15, after the upper surfaces of the interlayer dielectrics, not shown, between memory cell materials MC7' isolated in the word line direction are flattened by CMP, a material WL4' of the word line WL4 (a first wiring) and a material MC8'' of the memory cell MC8 are sequentially stacked over these upper surfaces. Here, as described above, the word line material WL4' is stacked with the thickness t9. For instance, the same material as the word line material WL3', such as the material made by reducing a tungsten seed (a first seed) by $B_2H_6$ (a first reducing gas), is used for the word line material WL4'.

Figure 16:
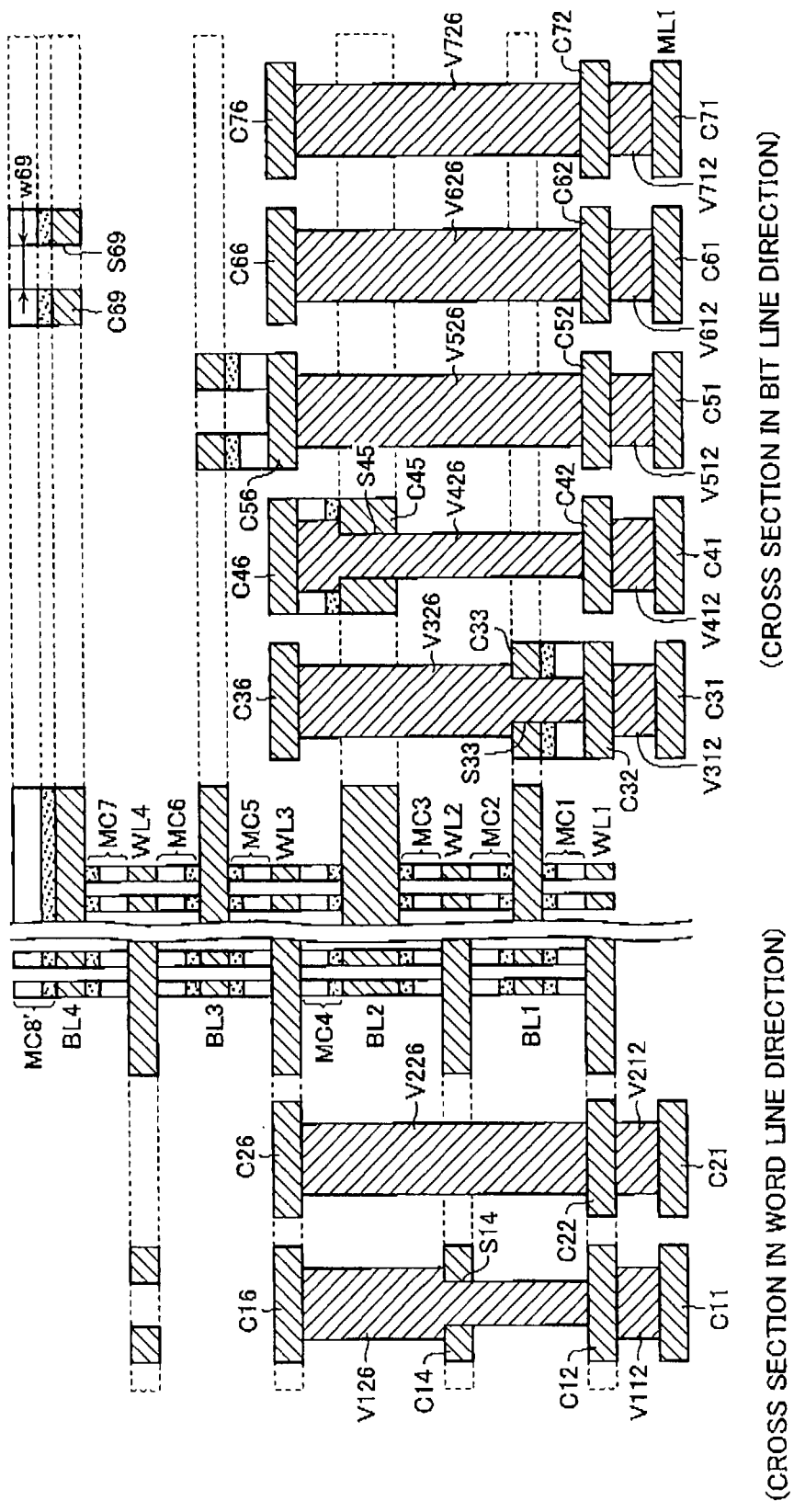
FIG. 16 is a diagram for explaining a method of manufacturing the semiconductor memory device.

As shown in FIG. 16, trenches having a depth to the upper surface of the word line WL4 are formed in the memory cell material MC8'', the bit line material BL4', and the memory cell material MC7' in the bit line direction by anisotropic etching such as RIE. Insulating materials are buried into the formed trenches to form the interlayer dielectrics. Thereby, the memory cell MC7 is formed in a self-aligning manner. The connecting portion C69 having the slit S69 is formed in the position of the layer of the bit line BL4 above the connecting portion C66. At the time of anisotropic etching in this process, over-etching is performed for reliably isolating the memory cells MC7. As a result, as shown in FIG. 6, the upper portion between the adjacent memory cells MC7 of the word line WL4 is removed. This phenomenon is called gouging, and in the example of FIG. 6, the memory cell MC7 is lowered by the distance d8 from the upper surface of the word line WL4 to the bottom portion between the memory cells. As a result, the effective thickness of the word line WL between the memory cells MC7 is t8-d8, which is smaller than other portion of the word line WL, e.g., the lower portion in which the memory cell MC7 is arranged.

Figure 17:
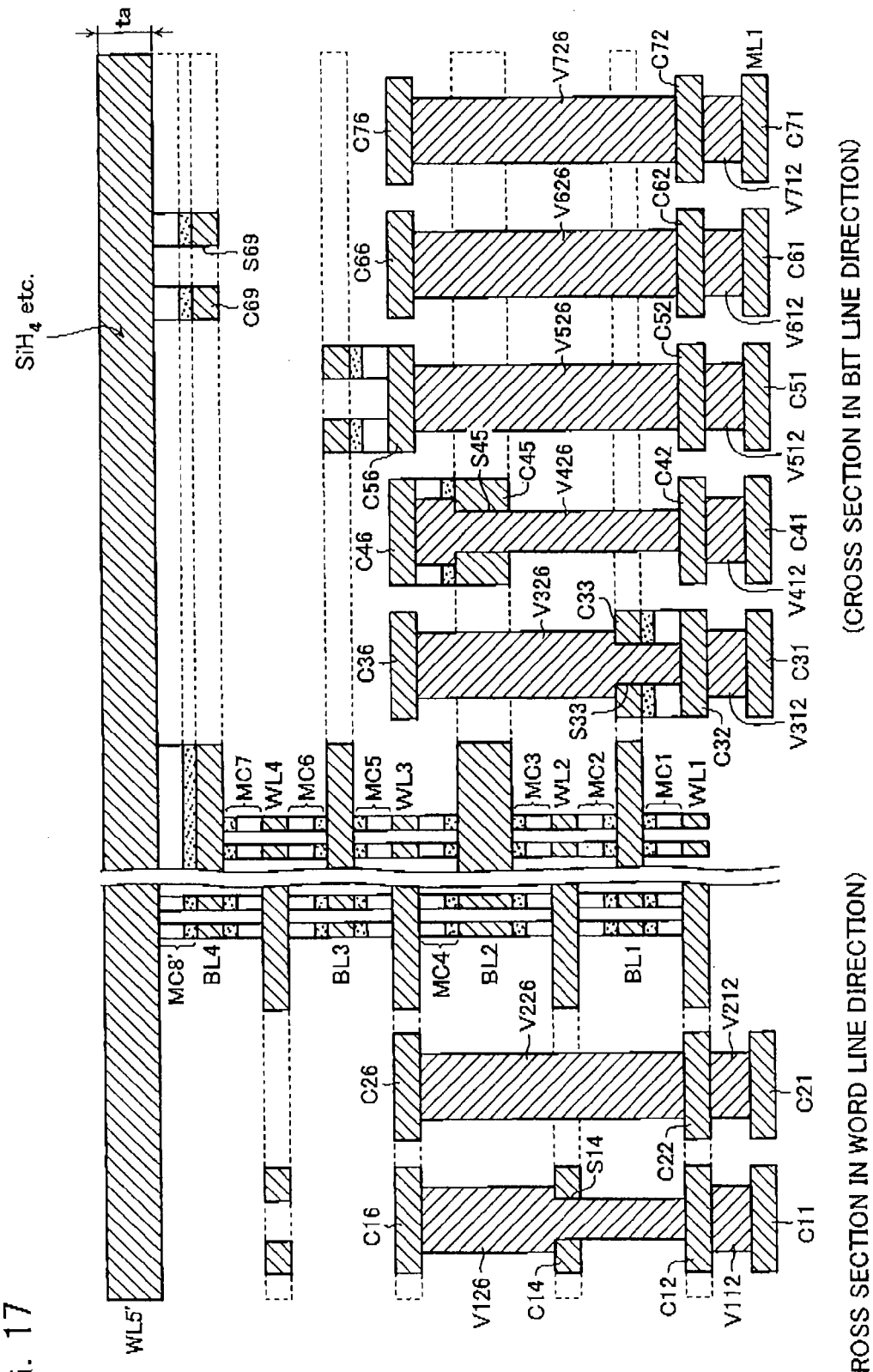
FIG. 17 is a diagram for explaining a method of manufacturing the semiconductor memory device.

As shown in FIG. 17, after the upper surfaces of the interlayer dielectrics, not shown, between the memory cell materials MC8' and MC8' isolated in the bit line direction are flattened by CMP, a material WL5' of the word line WL5 (a second wiring) is stacked over these upper surfaces. Here, the word line material BL5' is stacked with the thickness to larger than the thicknesses t8 and t9 of the wirings WL4 and BL4. The material made by reducing a tungsten seed (a first seed) by a second reducing gas different from $B_2H_6$ (a first reducing gas) is used for the word line material WL5' so that the sheet resistances of the word lines WL5 and WL4 and the bit line BL4 are the same. Here, $SiH_4$ or the like can be used for the second reducing gas. Thereby, the grain scale of the word line material WL5' can be smaller than the grain scale of the bit line BL3. In other words, the resistivity of the word line material WL5' is higher than that of the bit line material BL3'. As a result, when the word line WL5 is formed to have a cross section larger (a thickness is thicker) than that of the bit line BL3, the sheet resistances can be about the same. In addition to the change of the reducing gas, the resistivity may be higher than that of the bit line material BL3' by changing the seed film.

Figure 18:
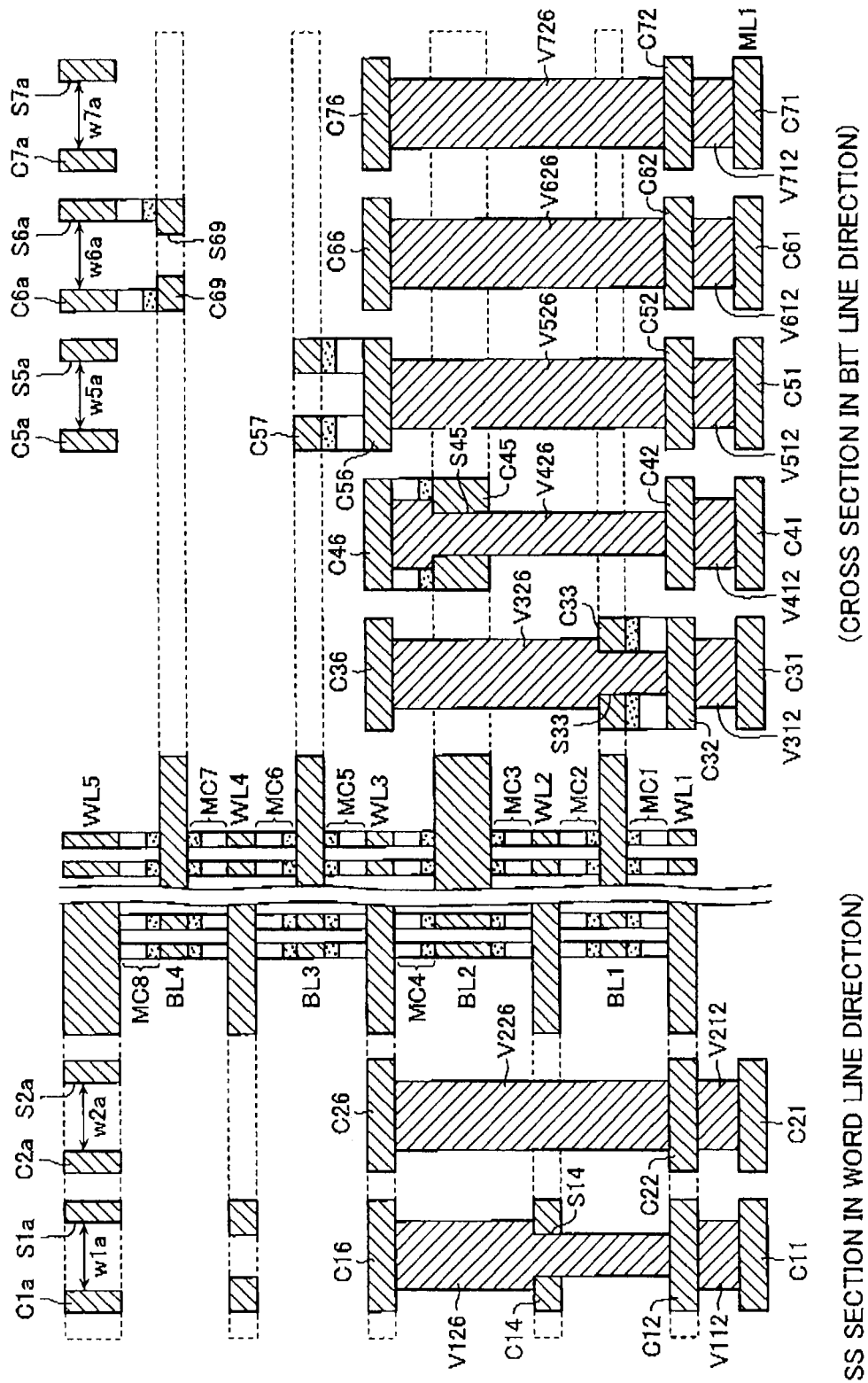
FIG. 18 is a diagram for explaining a method of manufacturing the semiconductor memory device.

As shown in FIG. 18, trenches having a depth to the upper surface of the bit line BL4 are formed in the word line material WL5' and the memory cell material MC8' in the word line direction by anisotropic etching such as RIE. Insulating materials are buried into the formed trenches and to the height of the lower surface of the metal layer ML2 formed later over the memory cell material MC8' to form interlayer dielectrics. Thereby, the memory cell MC8 is formed in a self-aligning manner. The connecting portion C1a having the slit S1a, the connecting portion C2a having the slit S2a, the connecting portion C5a having the slit S5a, the connecting portion C6a having the slit S6a, and the connecting portion C7a having the slit S7a are formed in the positions of the layer of the word line WL5 above the connecting portions C18, C26, C57, C69, and C76. At the time of anisotropic etching in this process, actually, as in the word line WL4, gouging may be caused in the upper portion of the bit line BL4. As one memory cell layer is isolated by etching, the amount of gouging of the bit line BL4 caused is reduced according to the etching conditions.

Figure 19:
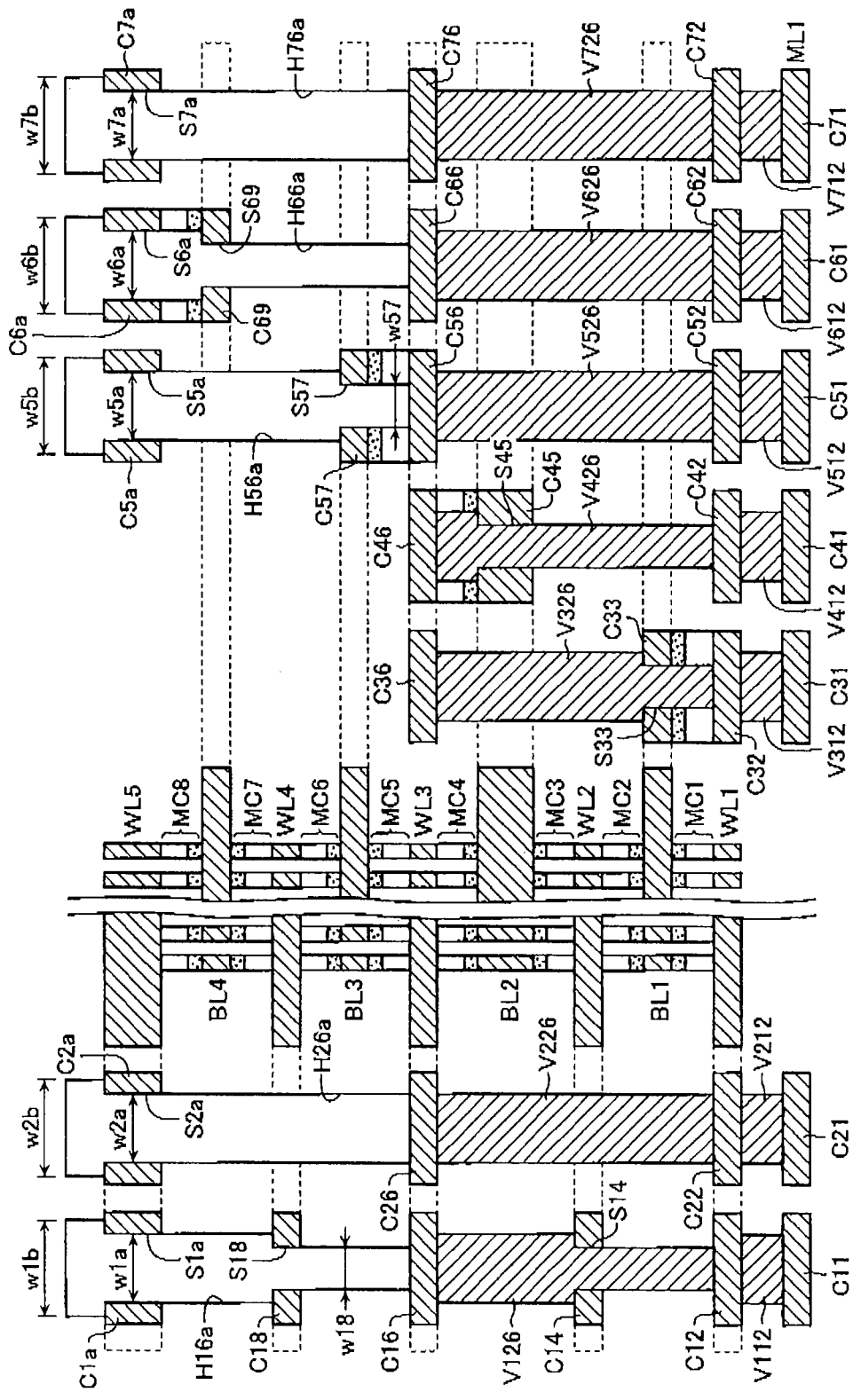
FIG. 19 is a diagram for explaining a method of manufacturing the semiconductor memory device.

As shown in FIG. 19, via holes H16a, H26a, H56a, H66a, and H76a extending in the stack direction from the height of the lower surface of the later-formed metal layer ML2 to the upper surface of the layer of the word line WL3 are formed together in the positions of the connecting portions C16, C26, C56, C66, and C76 with respect to the interlayer dielectrics, not shown, by anisotropic etching such as RIE. Here, digging called "shoulder damage" is caused by anisotropic etching in the connecting portions located in the intermediate layer of the via holes, that is, on the slit sides of the upper surfaces of the connecting portions C18, C57, C5a, C69, C6a, and C7a having the slits. Here, the "shoulder" refers to the vicinity of the upper portion facing the slit of the connecting portion. When the shoulder damage reaches the lower surface of the connecting portion C18 or the like, shoulder fall is caused so that the connecting portion is contacted only with the side surface of the via V. As a result, the contact of the via V and the connecting portion C becomes unstable, with the result that the processing margin and the operating margin of the semiconductor memory device are deteriorated. In particular, the upper layer of the connecting portion has the larger the amount of digging. Specifically, in the case of the via hole H56a, etching is performed at a time from the lower surface of the metal layer ML2 to the upper surface of the connecting portion C56, but in this case, the connecting portion C5a upper than the lower connecting portion C57 is subjected to stress due to etching for a longer time. The upper surface of the slit S5a should ideally have a shape in which, as shown by the dotted line indicated by IV in FIG. 7, the shoulder of the connecting portion C5a is substantially at right angle, the step of the via V56a is clearly formed, and the shoulder of the connecting portion C5a and the bottom portion and the side surface of the step are contacted. However, it is actually in a bowl shape due to the scraping of the shoulder of the via V56a, as shown by the solid line indicated by V in FIG. 7. Likewise, when the via holes H16a, H26a, H66a, and H76b are formed, the amount of digging of the connecting portions C1a, C2a, C6a, and C7a becomes maximum. In this case, even if the amount of digging of the via V56a is increased, when a substantially straight line portion is present in the lower portion of the connecting portion C5a facing the slit S5a, it can be understood that the steps are made in the via 56a, and it can be said that shoulder fall is not caused. In other words, the contact area is larger than when only the side surfaces of the via V56a and the connecting portion C5a are contacted although the via V56a engages the connecting portion C5a.

In this embodiment, since the word line WL5 can be formed to be thicker than the bit line BL4 or the like while the sheet resistances of the word line WL5 and the bit line BL4 or the like are maintained to be equal. As a result of the degradation of the operation margin can be suppressed by preventing shoulder fall. Further, the processing margin can be improved and the height of the memory cell MC can be increased. As a result, a reverse current at the time of non-write and read of the memory cell MC can be reduced.

At the formation of the vias V126, V226, ..., and V726, the amount of digging is maximum to the connecting portion C45 having the slit S45 formed in the bit line BL2 located in the uppermost position of the vias V126, V226, ..., V726. However, in this case, the thickness of the bit line BL2 may be equal to the thickness of the word line WL5.

Figure 20:
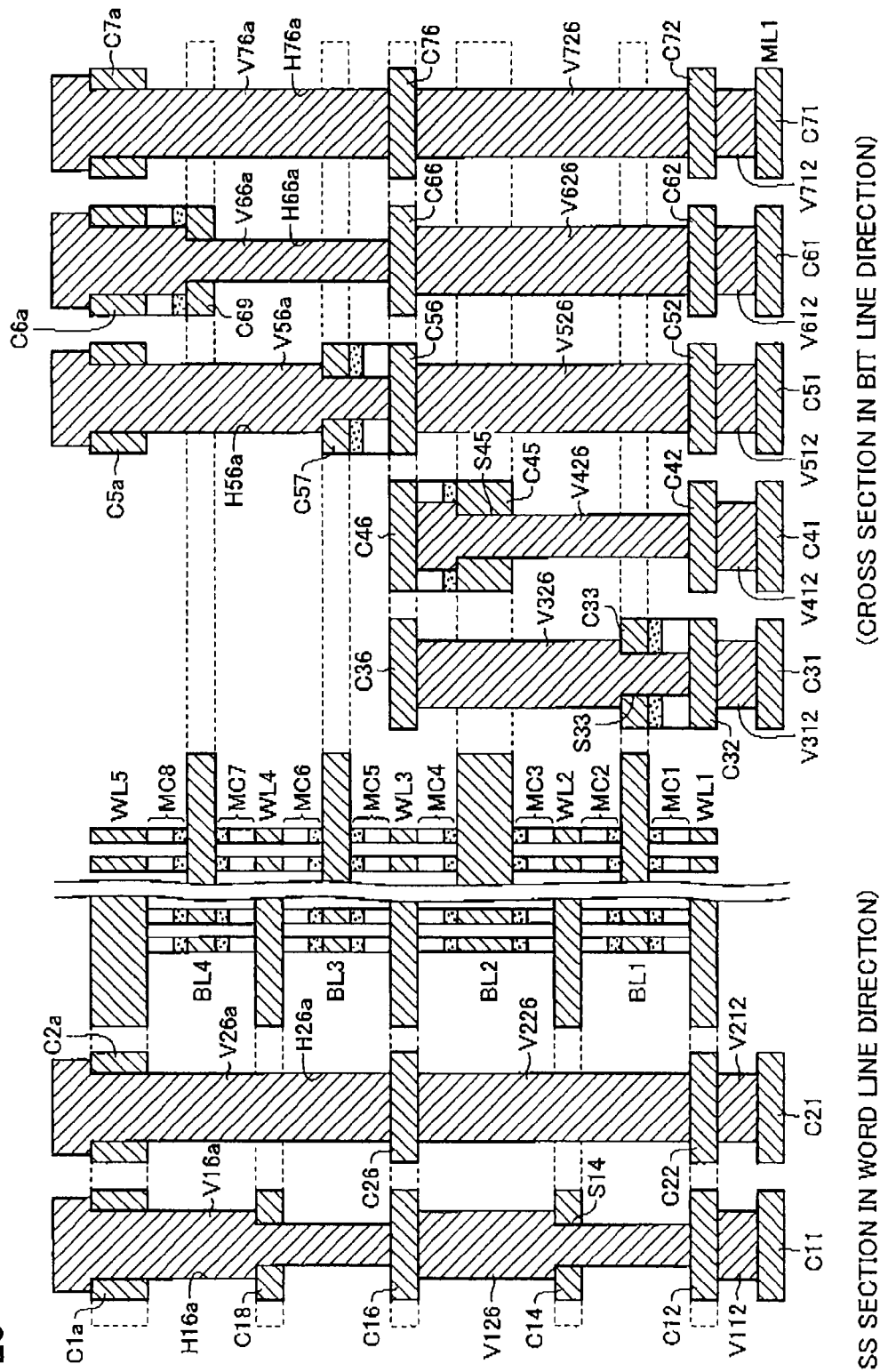
FIG. 20 is a diagram for explaining a method of manufacturing the semiconductor memory device.

As shown in FIG. 20, the via holes H16a, H26a, H56a, H66a, and H76a are filled with a conductive material to form the vias V16a, V26a, V56a, V66a, and V76a. When the metal layer M2 is formed over the upper surface of the via V76a, the semiconductor memory device shown in FIG. 5 is manufactured.

CONCLUSION

Finally, the influence of performing the method of manufacturing a semiconductor memory device on the operating margin and the processing margin is considered.

As a first point, gouging caused in the word line WL and the bit line BL at the time of the formation of the memory cell MC will be considered. As described above, in the method of manufacturing a semiconductor memory device according to this embodiment, gouging is caused except for the uppermost word line WL5 whose upper surface is not contacted with the memory cell MC. In other words, as the memory cells are not arranged over the uppermost word line WL5, there is not the process for isolating the memory cells. On the other hand, gouging due to anisotropic etching like the word line WL4 and the bit line BL4 cannot be caused in the word line WL5. As a result, if all the word lines WL and the bit lines BL are formed of the same material and with the same thickness, variation occurs in the characteristics of the uppermost word line WL5 and other word lines WL and bit lines BL, causing to the degradation of the operating margin.

Next, as a second point, shoulder fall caused in the connecting portion C having the slit S at the time of the formation of the via V (via hole H) will be considered. As described above, in the method of manufacturing a semiconductor memory device according to this embodiment, the connecting portions having the slits located in the intermediate layers of the via holes cause digging. And, the amount of shoulder damage in the upper connecting portion is larger than that in the lower connecting portion. In that case, when shoulder fall is caused, the operating margin is degradation.

The problem of the first point can be solved by making the word line WL5 thinner than other word lines WL and bit lines BL. In this case, as the sheet resistance of the word line WL5 is increased, the lowering of the sheet resistance caused by gouging of other word lines WL and bit lines BL is compensated for, so that the resistance values of the wirings can be substantially constant.

The problem of the second point can be solved by making the word line WL5 and the bit line BL2 thicker than other word lines WL and bit lines BL. In this case, the processing margin with respect to etching of the connecting portion C5a or the like having a larger amount of digging can be sufficiently secured.

However, the solving means of the problem of the first point and the solving means of the problem of the second point are contrary. In other words, as described above, the problem of the first point and the problem of the second point cannot be solved at the same time only by adjusting the thicknesses of the word lines WL and the bit lines BL.

In this embodiment, not only are the word line WL5 and the bit line BL2 thicker than other word lines WL and bit lines BL, but also the grain size of the material is reduced. Thereby, not only can variation in the sheet resistances of other word lines WL and bit lines BL be reduced, but also the connecting portion having a sufficient thickness with respect to shoulder fall can be formed. In other words, according to this embodiment, the semiconductor memory device and the method of manufacturing the same securing the processing margin and the operating margin can be provided.

[Others]

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

In the above embodiment, the ReRAM is used for the memory cell, but a cross point type memory cell is also applicable.

In addition, in the above embodiment, the manufacturing method in which two layers of the memory cell materials are processed at a time at the time of the formation of the memory cell has been described. However, the manufacturing method in which one layer of the memory cell material is processed at a time may be used if the via is formed across a plurality of layers at a time. Further, not only can the film thickness of the wiring on the uppermost layer be increased, but also the film thickness of the wiring can be gradually smaller from the upper layer toward the lower layer. In this case, to adjust the resistance of the wiring of each layer, the resistivity of the wiring can be reduced from the uppermost layer toward the lower layer. As a result, the processing margin and the operating margin can be further improved.

What is claimed is:
1. A semiconductor memory device comprising:
a cell array block having a plurality of cell arrays stacked therein, each of the cell arrays including a plurality of memory cells and a plurality of selective wirings selecting the plurality of memory cells;
a pillar-shaped first via extending in a stack direction from a first height to a second height and having side surfaces connected to a first wiring; and
a pillar-shaped second via extending in the stack direction from the first height to the second height and having side surfaces connected to a second wiring disposed above the first wiring,
the second wiring being thicker in the stack direction than the first wiring and having a higher resistivity than the first wiring.
2. The semiconductor memory device according to claim 1, wherein the plurality of memory cells are formed on an upper surface of the first wiring at a first pitch, and
the thickness of the first wiring is smaller than the thickness of the second wiring.
3. The semiconductor memory device according to claim 1, wherein an amount of digging from a surface of the second wiring of a connecting portion of the second wiring connected to the second via is larger than that from a surface of the first wiring of a connecting portion of the first wiring connected to the first via.

4. The semiconductor memory device according to claim 1, wherein a material of the first wiring is a material made by reducing a first seed using a first reducing gas, and
a material of the second wiring is a material made by reducing the first seed using a second reducing gas different from the first reducing gas.

5. The semiconductor memory device according to claim 4, wherein the first seed is a tungsten seed,
the first reducing gas is $B_2H_6$, and
the second reducing gas is $SiH_4$.

6. The semiconductor memory device according to claim 1, wherein the first and second wirings are one of a plurality of word lines and bit lines crossing each other, and
the memory cells are provided in crossing portions of the word lines and the bit lines.

7. The semiconductor memory device according to claim 1, wherein each of the memory cells has a variable resistance element and a non-ohmic element connected in series.

8. A semiconductor memory device comprising:
a cell array block having a plurality of cell arrays stacked therein, each of the cell arrays including a plurality of memory cells and a plurality of selective wirings selecting the plurality of memory cells;
a pillar-shaped first via extending in a stack direction and having side surfaces connected to a first wiring; and
a pillar-shaped second via extending in the stack direction and having side surfaces connected to a second wiring,
a length from the second wiring to a bottom surface of the second via being longer than that from the first wiring to a bottom surface of the first via,
the second wiring being thicker in the stack direction than the first wiring and having a higher resistivity than the first wiring.

9. The semiconductor memory device according to claim 8, wherein the plurality of memory cells are formed on an upper surface of the first wiring at a first pitch, and
the thickness of the first wiring is smaller than the thickness of the second wiring.

10. The semiconductor memory device according to claim 8, wherein an amount of digging from a surface of the second wiring of a connecting portion of the second wiring connected to the second via is larger than that from a surface of the first wiring of a connecting portion of the first wiring connected to the first via.

11. The semiconductor memory device according to claim 8, wherein a material of the first wiring is a material made by reducing a first seed using a first reducing gas, and
a material of the second wiring is a material made by reducing the first seed using a second reducing gas different from the first reducing gas.

12. The semiconductor memory device according to claim 11, wherein the first seed is a tungsten seed,
the first reducing gas is $B_2H_6$, and
the second reducing gas is $SiH_4$.

13. The semiconductor memory device according to claim 8, wherein the plurality of selective wirings are a plurality of word lines and bit lines crossing each other, and
the memory cells are provided in crossing portions of the word lines and the bit lines.

14. The semiconductor memory device according to claim 8, wherein each of the memory cells has a variable resistance element and a non-ohmic element connected in series.

\* \* \* \* \*